(12) United States Patent
Hiraizumi et al.

(10) Patent No.: US 7,291,357 B2
(45) Date of Patent: Nov. 6, 2007

(54) THIN FILM DEPOSITION METHOD AND THIN FILM DEPOSITION APPARATUS

(75) Inventors: Atsushi Hiraizumi, Tokyo (JP); Koji Masuda, Tokyo (JP); Hiroyuki Abe, Tokyo (JP); Tetsuro Wada, Tokyo (JP); Koichi Shintomi, Tokyo (JP); Kazuyou Mizuno, Tokyo (JP)

(73) Assignee: The Furukawa Electric Co., Ltd. (JP)

( * ) Notice: Subject to any disclaimer, the term of this patent is extended or adjusted under 35 U.S.C. 154(b) by 742 days.

(21) Appl. No.: 10/330,385

(22) Filed: Dec. 26, 2002

(65) Prior Publication Data

US 2003/0180454 A1    Sep. 25, 2003

(30) Foreign Application Priority Data

Dec. 28, 2001    (JP)    ............................... 2001-401666

(51) Int. Cl.
  *B05D 5/06*    (2006.01)
(52) U.S. Cl. ...................... 427/162; 427/166; 427/167; 427/585; 427/594
(58) Field of Classification Search ................ 427/162, 427/166, 167, 585, 594
  See application file for complete search history.

(56) References Cited

U.S. PATENT DOCUMENTS 3,892,490 A * 7/1975 Uetsuki et al. ............. 356/388
5,505,779 A * 4/1996 Mizuno et al. ............. 118/719
5,527,417 A * 6/1996 Iida et al. .............. 156/345.43

* cited by examiner

Primary Examiner—Alain L. Bashore
(74) Attorney, Agent, or Firm—Cantor Colburn LLP

(57) ABSTRACT

A thin film deposition method for producing an optical film with an optical characteristic on a deposition substrate in a vacuum chamber is provided. The method may include preparing in the vacuum chamber a deposition source which is a source of the film producing material; holding the deposition substrate with a substrate holding member; arranging the deposition substrate and the deposition source such that, given that a vertical distance from the center of the deposition substrate to the deposition source is defined as ZK and a horizontal distance between the deposition substrate and the deposition source as Xk, Xk/Zk is set to satisfy a following equation $0.48 \leq Xk/Zk \leq 0.78$; rotating the deposition substrate on a rotational axis which is orthogonal to the deposition substrate; and evaporating the film producing material of the deposition source to perform deposition on the deposition substrate.

9 Claims, 23 Drawing Sheets

φ 200

B channel
(1550.8 nm)

A channel
(1550 nm)

5 Deposition Substrate

φ 200

5 Deposition Substrate

Relation between a deposition substrate temperature and a deposition thickness

THIN FILM DEPOSITION METHOD AND THIN FILM DEPOSITION APPARATUS

This application claims priority to Japanese Patent Application 2001-401666, which was filed in Japan on Dec. 28, 2001. Japanese Patent Application 2001-401666 is herein incorporated by reference in its entirety.

FIELD OF THE INVENTION

The present invention relates to a thin film deposition method and a thin film deposition apparatus both for producing optical thin films with optical characteristics such as optical filters and the like used in fiber-optic communications.

RELATED ART

With the arrival of a broadband era, demands for further increase in data transmission capacity are growing. Under such circumstances, expectations have been placed on WDM (Wavelength Division Multiplexing) transmission systems for wavelength-multiplexing a plurality of light beams of different wavelengths to transmit a wavelength-multiplexed light signal.

As one of the key devices supporting such WDM transmission systems, there are optical filters which optically acts on incident light. Such optical filers include optical Band Pass Filters (BPF) for transmitting only light with a preset desired wavelength out of the incident light obtained by wavelength-multiplexing light beams of different wavelengths, and Gain Flattening Filters (GFF) for flattening an output of an optical fiber amplifier such as EDFA (Erbium-doped Fiber Amplifier) or the like.

As such optical filter, there is known a multilayer film filter consisting of a plurality of thin films with different refractive indices. This multilayer thin film filter makes it possible to obtain a desired wavelength loss profile by setting thickness and refractive indices of each layer suitably.

As a thin film deposition method and a thin film deposition apparatus both for producing a multilayer thin film filter, or multilayer thin film, there is known a method and apparatus in which optical films (filter films) are deposited sequentially on a substrate by utilizing vacuum deposition technique or sputtering technique, for example.

FIG. 18 is a schematic view showing a conventional thin film deposition apparatus 50.

As shown in FIG. 18, the conventional deposition apparatus 50 comprises a vacuum chamber 51 which has placed at a bottom portion thereof a deposition source 52 containing a deposition material. Above the deposition source 52, a substrate holder 54 is provided having a substrate attachment surface 53 in parallel with a horizontal plane containing the deposition source 52 (or horizontal plane containing the deposition source when this deposition source is made closely analogous to a point). A deposition substrate 55 (substrate on which a thin film is deposited) is attached to the substrate attachment surface 53 on the substrate holder 54.

More specifically, a deposition material in the deposition source 52 is heated by means of a heating apparatus (not shown) and evaporated. Particles of the evaporated material rise inside the vacuum chamber 51 and reach the deposition substrate 55 to form a thin film layer on the deposition substrate 55.

The above-described thin film deposition process is sequentially repeated using a plurality of deposition materials with different refractive indices, thereby forming a multilayer thin film on the deposition substrate 55.

As described above, since a multilayer thin film filter can obtain desired filtering characteristics due to thickness of each thin film layer forming the multilayer thin film, it is required to establish the thickness of each layer with high accuracy.

However, in the conventional thin film deposition method and apparatus, the deposition source and the deposition substrate are not arranged at appropriate positions. This results in discrepancies in the amount of deposited material (thickness distribution) on the deposition substrate across the whole deposition work.

This thickness distribution causes variation in optical characteristics of a completed optical filters (for example, difference in characteristics between regions of different thicknesses in the optical filter), which makes it difficult to produce an optical filter which can offer a uniform desired loss profile.

Particularly, the above-mentioned optical filter such as a BPF which requires high accuracy in establishing thickness distribution has a quite severe specification of the thickness distribution with less than 0.1% deviation.

Accordingly, a deposition area per batch became smaller and the manufacturing yield was low.

Since the distance between the deposition source and the center of the deposition substrate is different from the distance between the deposition source and the peripheral portion of the deposition substrate in the over all deposition work, there appears discrepancies in the amount of deposited material on the surface of the deposition substrate. Accordingly, although there is no problem in the region such as the center portion of the substrate where the thickness of the deposition is always investigated during the deposition work, the regions except the above region do not satisfy the prescribed optical characteristics as the optical fiber.

As a result, since the thickness distribution is different in H layers and L layers of the band pass filter, the optical characteristics deteriorates as it goes farther from the center of the substrate. Thus, the yield of the filter materials produced by a piece of the deposition substrate becomes lower.

SUMMARY OF THE INVENTION

The first embodiment of the thin film deposition apparatus of the present invention is a thin film deposition apparatus for producing an optical film with an optical characteristic on a deposition substrate in a vacuum chamber by depositing a film producing material on the deposition substrate, comprising: (a) at least one deposition source which is provided in the vacuum chamber and includes the film producing material; (b) a substrate holding member, provided in the vacuum chamber, for holding the deposition substrate; and (c) a rotation mechanism for rotating the deposition substrate on a rotational axis which is orthogonal to the deposition substrate, said thin film deposition apparatus in which, given that a point of intersection of a horizontal plane containing said deposition source and a reference line which passes through a center of the deposition substrate 5 and is orthogonal to the horizontal plane is defined as a first point of intersection, and a distance from the first point of intersection to the center of the deposition substrate is defined as Zk and a distance from the first point of intersection to the deposition source as Xk, Xk/Zk is set so as to fall within a range shown below:

$$0.48 \leq Xk/Zk < 0.78 \quad (1)$$

The second embodiment of the thin film deposition apparatus of the present invention is a thin film deposition apparatus for producing an optical film with an optical characteristic on a deposition substrate in a vacuum chamber by depositing a film producing material on the deposition substrate, comprising: (a) at least one deposition source which is provided in the vacuum chamber and includes the film producing material; (b) a substrate holding member, provided in the vacuum chamber, for holding the deposition substrate in such a manner that the deposition substrate is inclined at a predetermined inclination angle relative to a horizontal plane containing the deposition source; and (c) a rotation mechanism for rotating the deposition substrate on a rotational axis which is orthogonal to the deposition substrate.

The third embodiment of the thin film deposition apparatus of the present invention is a thin film deposition apparatus in which, given that the inclination angle of the deposition substrate held by the substrate holding member is $\Psi$, a point of intersection of a horizontal plane containing said deposition source and a reference line which passes through a center of the deposition substrate and is orthogonal to the horizontal plane is defined as a first point of intersection, a distance from the first point of intersection to the center of the deposition substrate is defined as Zk and a distance from the first point of intersection to the deposition source as Xk, when Xk/Zk meets an equation (2), the inclination angle $\Psi$ is set so as to fall within a range shown by an equation (3), and when Xk/Zk meets an equation (4), the inclination angle $\Psi$ is set so as to fall within a range shown by an equation (5).

$$0.2 \leq Xk/Zk < 0.48 \quad (2)$$

$$-4565.8 \cdot (Xk/Zk)^3 + 3559.20 \cdot (Xk/Zk)^2 - 742.11 \cdot (Xk/Zk) + 42.58 \leq \Psi \square 780.27 \cdot (Xk/Zk)^3 + 1171.9 \cdot (Xk/Zk)^2 - 674.25 \cdot (Xk/Zk) + 186.25 \quad (3)$$

$$0.48 \leq Xk/Zk \leq 0.78 \quad (4)$$

$$\Psi \leq -780.27 \cdot (Xk/Zk)^3 + 1171.9 \cdot (Xk/Zk)^2 - 674.25 \cdot (Xk/Zk) + 186.25 \quad (5)$$

The fourth embodiment of the thin film deposition apparatus of the present invention is a thin film deposition apparatus in which at least one deposition source comprises at least two deposition sources, and said at least two deposition sources are equally spaced from a reference line which passes through a center of said deposition substrate and is orthogonal to the horizontal plane containing one of said two deposition sources.

The fifth embodiment of the thin film deposition apparatus of the present invention is a thin film deposition apparatus in which the deposition substrate is inclined toward a midpoint between said at least two deposition sources.

The sixth embodiment of the thin film deposition apparatus of the present invention is a thin film deposition apparatus in which at least one deposition source comprises three or more deposition sources, and said three or more deposition sources are circumferentially spaced uniformly from each other.

The seventh embodiment of the thin film deposition apparatus of the present invention is a thin film deposition apparatus further comprising: a monitoring light source; a shutter device for starting/shutting off a deposition operation of each of said deposition sources; a photoreceiver for receiving monitor light which is allowed to pass through the film deposited on the deposition substrate; and a controller for receiving a light amount signal corresponding to an amount of received monitor light to control an operation of said shutter device based on the light amount signal.

The eighth embodiment of the thin film deposition apparatus of the present invention is a thin film deposition apparatus in which said deposition sources include deposition materials of different reflective indices.

The ninth embodiment of the thin film deposition apparatus of the present invention is a thin film deposition apparatus in which one or more than two heating sources or cooling sources are arranged in a near portion of the deposition substrate to provide the deposition substrate with a prescribed temperature distribution.

The tenth embodiment of the thin film deposition apparatus of the present invention is a thin film deposition apparatus which includes a distance adjusting means to adjust a distance between said deposition substrate and said heating source or said cooling source so as to be a prescribed distance.

The first embodiment of the thin film deposition method of the present invention is a thin film deposition method for producing an optical film with an optical characteristic on a deposition substrate in a vacuum chamber, comprising the steps of: (a) preparing in the vacuum chamber a deposition source which is a source of the film producing material; (b) preparing a substrate holding member for holding the deposition substrate, and holding the deposition substrate by means of said substrate holding member; (c) arranging the deposition substrate and the deposition source in such a manner that, given that a point of intersection of a horizontal plane containing said deposition source and a reference line which passes through a center of the deposition substrate and is orthogonal to the horizontal plane is defined as a first point of intersection, and a distance from the first point of intersection to the center of the deposition substrate is defined as Zk and a distance from the first point of intersection to the deposition source is desfined as Xk, Xk/Zk is set to satisfy a following equation (6):

$$0.48 \leq Xk/Zk \leq 0.78 \quad (6); \text{ and}$$

(d) rotating the deposition substrate on a rotational axis which is orthogonal to the deposition substrate.

The second embodiment of the thin film deposition method of the present invention is a thin film deposition method for producing an optical film with an optical characteristic on a deposition substrate in a vacuum chamber, comprising the steps of: (a) preparing in the vacuum chamber a deposition source which is a source of a film producing material; (b) preparing a substrate holding member for holding the deposition substrate, and holding the deposition substrate by means of said substrate holding member in such a manner that the deposition substrate is inclined at a predetermined inclination angle relative to the horizontal plane containing said deposition source; and (c) in the vacuum chamber which is evacuated to create a vacuum, evaporating the film producing material of said deposition material to perform deposition on the deposition substrate while the deposition substrate is rotated on a rotational axis which is orthogonal to the deposition substrate.

The third embodiment of the thin film deposition method of the present invention is a thin film deposition method for producing an optical film with an optical characteristic on a deposition substrate in a vacuum chamber, comprising the steps of: arranging at least two deposition sources at predetermined positions; rotating the deposition substrate on a center axis of the deposition substrate, said deposition substrate being inclined at a predetermined angle relative to a horizontal plane containing one of said deposition sources, and depositing an evaporated deposition material of said deposition source on the deposition substrate to produce a film; and controlling a deposition operation of each of said at least two deposition sources based on an amount of light which is allowed to pass through the film deposited on the deposition substrate so as to leave the film with a predetermined thickness.

The fourth embodiment of the thin film deposition method of the present invention is a thin film deposition method in which said deposition sources include deposition materials of different reflective indices, and are individually opened/shut off so as to control the deposition operation.

The fifth embodiment of the thin film deposition method of the present invention is a thin film deposition method in which a prescribed temperature distribution is provided with said deposition substrate by means of one or more than two heating sources or cooling sources arranged in a near portion of the deposition substrate to provide a prescribed thickness distribution with said deposition substrate.

The sixth embodiment of the thin film deposition method of the present invention is a thin film deposition method in which a thickness distribution in H layers of a band pass filter is made equal to a thickness distribution in L layers thereof.

The seventh embodiment of the thin film deposition method of the present invention is a thin film deposition method in which a band pass filter for a plurality of wavelengths is formed on the deposition substrate by one process.

DETAILED DESCRIPTION OF THE INVENTION

It is an object of the present invention to provide a thin film deposition method and a thin film deposition apparatus both for achieving a uniform thickness over each layer of a thin film multilayer-filter or, for example, a thickness distribution with less than 0.1% deviation. Another object of the present invention is to provide a thin film deposition method and a thin film deposition apparatus both for producing a thin film multilayer-filter with a uniform thickness distribution over a large deposition area.

Referring to the accompanying drawings, embodiments of the present invention will now be described.

Figure 1:
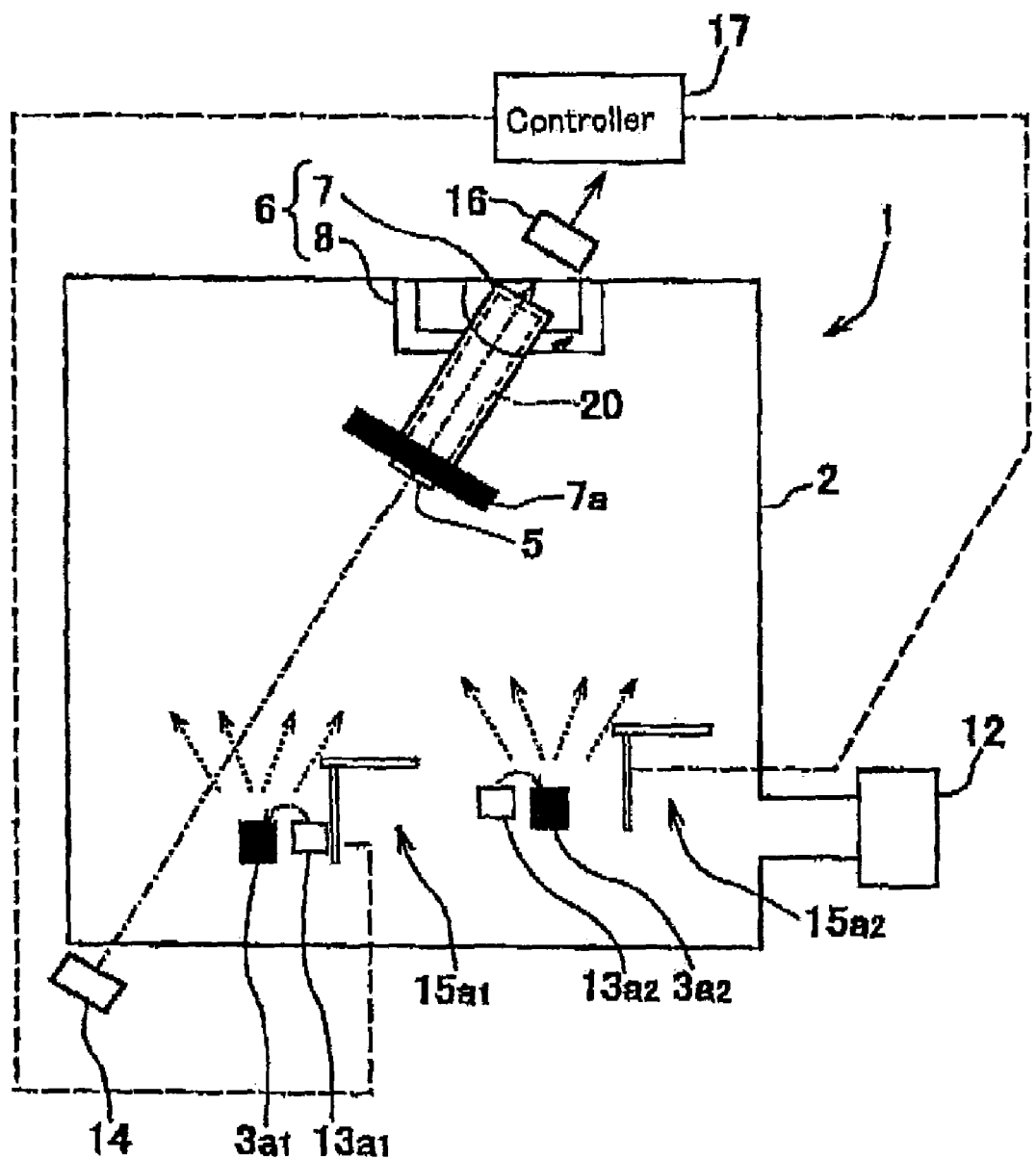
FIG. 1 is a schematic view for illustrating a configuration of a thin film deposition apparatus according to an embodiment of the present invention.

FIG. 1 is a schematic view illustrating a configuration of a thin film deposition apparatus 1 according to an embodiment of the present invention.

As shown in FIG. 1, the deposition apparatus 1 comprises: two deposition sources 3a1 and 3a2 (crucibles or the like) arranged at the bottom of a vacuum chamber 2, for example; and a substrate holding member 6, provided at the opposite side to (above) the deposition sources 3a1 and 3a2 in the vacuum chamber 2, for holding a deposition substrate 5.

The two deposition sources 3a1 and 3a2 have therein deposition materials, which may include, for example, oxides of the tantalum type, titanium type or niobium type for materials of high refractive indices and primarily oxide of the silicon type for a materials of low refractive indices.

In this embodiment, as illustrated in FIG. 1, the substrate holding member 6 comprises: a holder rotation support 7 which has a disc-shaped substrate holder 7a supporting the deposition substrate 5 and rotatably supports the substrate holder 7a; and a rigid support 8, arranged opposed to the deposition sources 3a1 and 3a2 and in parallel to a horizontal plane containing each of the deposition sources 3a1 and 3a2 (horizontal plane containing each of the deposition sources 3a1 and 3a2 when the deposition source is made closely analogous to a point, and also being an evaporation surface from which a deposition material is evaporated). The rigid support 8 supports the holder rotation support 7 so as to be fixed.

In the present embodiment, as shown in FIG. 1, the holder rotation support 7 is supported by the rigid support 8 in such a manner that the substrate holder 7a of the holder rotation support 7 is inclined at a predetermined angle Ψ relative to a plane parallel to the horizontal plane containing the above-mentioned deposition source. In other words, it is an angle Ψ that is formed by the substrate holder 7a and the plane parallel to the horizontal plane containing the above-mentioned deposition source.

The thin film deposition apparatus 1 further comprises: an air exhaustive pump 12, provided at one side wall of the chamber 2, for exhausting air from the inside of the chamber 2 to form a vacuum state chamber; electron guns 13a1 and 13a2, provided in the vacuum chamber 2, for radiating the deposition sources 3a1 and 3a2 with electron beams to heat the deposition materials in the deposition sources 3a1 and 3a2; and a light source 14 for projecting a monitor light for monitoring film thickness during deposition.

Furthermore, the deposition apparatus 1 comprises: shutter devices 15a1 and 15a2 which cover upper sides of the deposition sources 3a1 and 3a2 based on shutter signals to shut off an operation of deposition and, on the other hand, open upward the deposition sources 3a1 and 3a2 based on opening signals to start the operation; a photoreceiver 16 for receiving monitor light which is projected from the light source 14 and allowed to pass through a thin film to be deposited, the deposition substrate 5 and the like during deposition; and a controller 17 for receiving from the photoreceiver 16 a light amount signal corresponding to the amount of the monitor light received by the photoreceiver 16 and transmitting a shutter signal/a opening signal to the shutter devices 15a1 and 15a2, individually, based on the received light amount signal to control thickness of each thin film layer deposited on the deposition substrate 5.

In addition, the holder rotation support 7 has a rotation mechanism 20 provided for rotating the substrate holder 7a on a rotational axis which passes through the center of the substrate holder 7a and is orthogonal to the substrate holder 7a. The rotation mechanism 20 has a motor, of which a driving shaft is connected to the center of the substrate holder 7a. Consequently, the substrate holder 7a is rotatable around the center axis thereof by driving the rotation mechanism 20 (motor).

The two deposition sources 3a1 and 3a2 are arranged at the same distance from the reference line LR which passes through the center of the substrate holder 7a and is orthogonal to the horizontal plane containing the deposition source 3a1 or 3a2, and also circumferentially spaced 180 degree from each other.

The inclination direction of the substrate holder 7a, that is, that of the deposition substrate 5 is such as directed to the midpoint between two deposition sources 3a1 and 3a2 (or 90 degree direction circumferentially from the deposition sources 3a1 and 3a2).

Hereinafter, a whole operation of a thin film deposition apparatus 1 in accordance with the embodiment of the present invention will be described.

First, an air exhaustive pump 12 is activated, and air inside a chamber 2 is exhausted therefrom so as to form a vacuum state chamber 2. Then, a controller 17 transmits an opening signal to one shutter device (e.g. shutter device 15a1) to allow the shutter device 15a1 to perform an opening operation. Next, the controller transmits a shutter signal to the other shutter device (e.g. shutter device 15a2) so as to allow the shutter device 15a2 to perform a closing operation (shutter operation).

In this situation, electron guns 13a1 and 13a2 are activated so as to radiate the deposition sources 3a1 and 3a2 with electron beams, which heat to melt and evaporate deposition materials in the deposition sources 3a1 and 3a2.

Particles of an evaporated material from the deposition source 3a1 above which the shutter device is not placed move upward in the vacuum chamber 2 and reach the deposition substrate 5.

The deposition substrate 5, which is integral with the substrate holder 7a, is rotated on an axis which passes through the center of the deposition substrate and is orthogonal to the deposition substrate surface. The particles of the evaporated material are deposited to the surface of the deposition substrate 5 which is rotating on the axis thereof, thereby forming a thin film layer on the surface of the deposition substrate.

On the other hand, a monitor light which is projected from a light source 14 and allowed to pass through the deposition substrate 5 and the like is then transmitted to the controller 17 via a photoreceiver 16 as a light amount signal corresponding to the amount of the monitor light received by the photoreceiver 16.

The controller 17 monitors thickness of the thin film layer formed on the surface of the deposition substrate 5 corresponding to the light amount signal. Once the thickness reaches a predetermined thickness, the shutter devices are switched (shutter device 17a1→shuttering operation; shutter device 17a2→opening operation). After this switching, a deposition material different from that of the previously formed thin film is then evaporated, another thin film layer is formed and deposited onto the previously formed thin film layer.

The above-described thin film deposition operation is repeated by switching the shutter devices, and thereby, it is possible to manufacture multiple thin film layers on the surface of the deposition substrate 5.

According to the present invention, thin film deposition on the deposition substrate 5 is performed while the substrate holder 7a or the deposition substrate 5 is inclined and rotated on its axis relative to the deposition sources 3a1 and 3a2. Hence, through rotations, in total, the distance from each of the deposition sources 3a1 and 3a2 to the center of the substrate 5 can be approximately equal to the distance from each of the deposition sources 3a1 and 3a2 to one edge portion of the substrate 5.

Verification results will now be described which are obtained by actual deposition using a thin film deposition apparatus 1 and a deposition method in accordance with the present embodiment.

For example, three substrate holders 7a are prepared φ 200 in diameter and provided each with fitting openings 25 (φ 22.5) at the center point A thereof and points B to E all at the same distance from the center A (points corresponding to apexes of a square with the center point A). Then, a deposition substrate 5 is fitted into each of the fitting openings 25 of each of the substrate holders 7a. A holder rotation support 7 of a substrate holding member 6 is mounted on a rigid support 8 in such a manner that the holder 7a (deposition substrates 5) is (1) not inclined (or at the inclination angle Ψ of 0 degree), (2) is inclined at the inclination angle Ψ of 20 degree and (3) inclined at the inclination angle Ψ of 40 degree.

Figure 3:
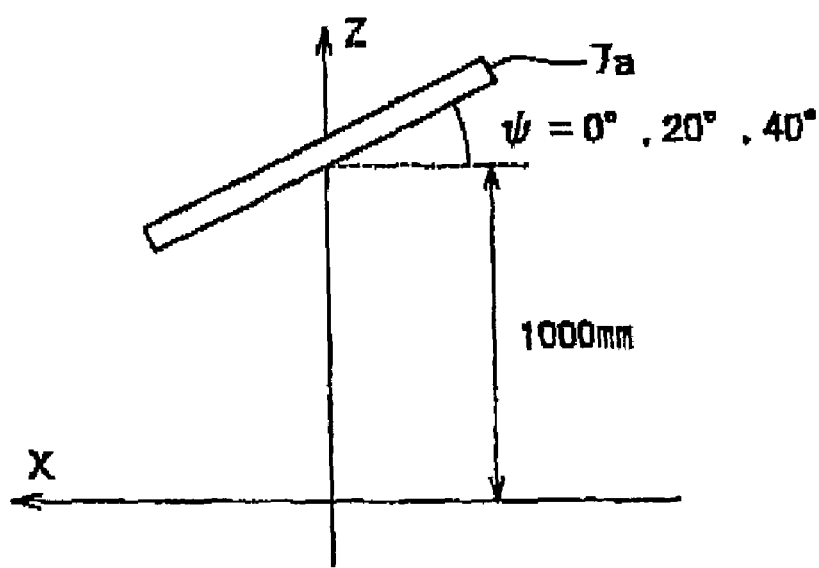
FIG. 3 shows relative positions of a deposition source and a substrate holder during deposition in an effect verification test according to the embodiment of the present invention.
Figure 4:
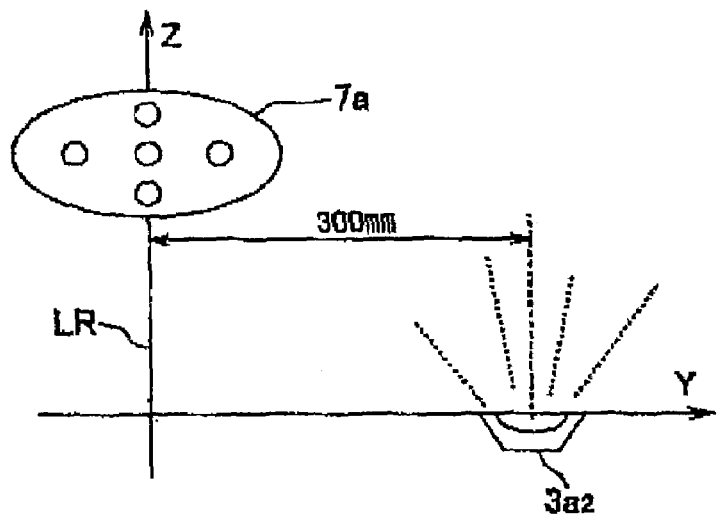
FIG. 4 shows relative positions of a deposition source and a substrate holder during deposition in the effect verification test according to the embodiment of the present invention.

Then, in accordance with the above-described deposition operation, deposition on the deposition substrates 5 of the aforementioned pattern (1) to (3) is performed, for example, using SiO2 as a deposition material and changing a rotational speed of the substrate holder 7a (0 rpm, 200 rpm, 800 rpm). Now, relative positions of the deposition source (e.g., 3a2) and the substrate holder 7a during deposition are shown in FIGS. 3 and 4.

More specifically, the substrate holder 7a of the inclination angle Ψ of 0, 20 or 40 degree is arranged with the center therof 1000 mm high from the evaporation surface. The deposition sources 3a1 and 3a2 are arranged at the same distance (300 mm) from the reference line LR which passes through the center of the substrate holder 7a and is orthogonal to the horizontal plane containing each of the deposition sources 3a1 and 3a2.

In such deposition, for example, the light amount signal based on the amount of light which passes through a deposition substrate 5 (A) located at the center A of the substrate holder 7a is monitored by the controller 17. Then, once optical thickness reaches a quarter of 1550 nm, a shutter device is activated to shut off deposition.

For the above-mentioned substrate holders 7a for (1) to (3), physical thicknesses of deposition materials (e.g., $SiO_2$, however other deposition material such as $Ta_2O_5$ or the like may be used.) deposited on five deposition substrates 5 are measured. Then, assuming that the film thickness on the substrate 5 (A) located at the center A of the substrate holder 7a is 1, the other thicknesses are converted (normalized) as shown in FIGS. 5 to 7

Figure 5:
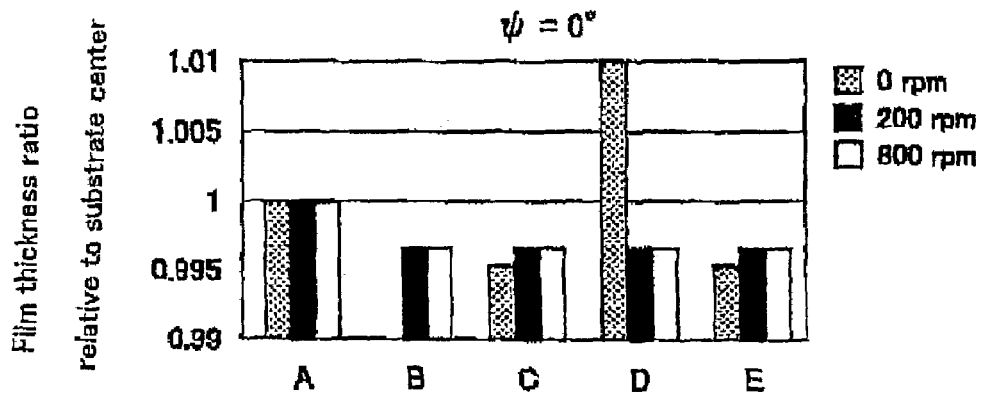
FIG. 5 is a graph for showing layer thickness deviation when deposition substrates are inclined at the inclination angle of 0 degree in the effect verification test according to the embodiment of the present invention.
Figure 6:
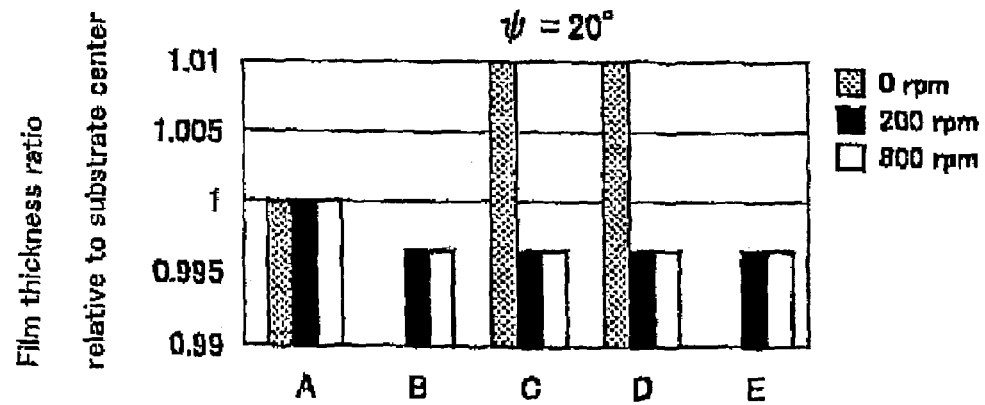
FIG. 6 is a graph for showing layer thickness deviation when deposition substrates are inclined at the inclination angle of 20 degree in the effect verification test according to the embodiment of the present invention.
Figure 7:
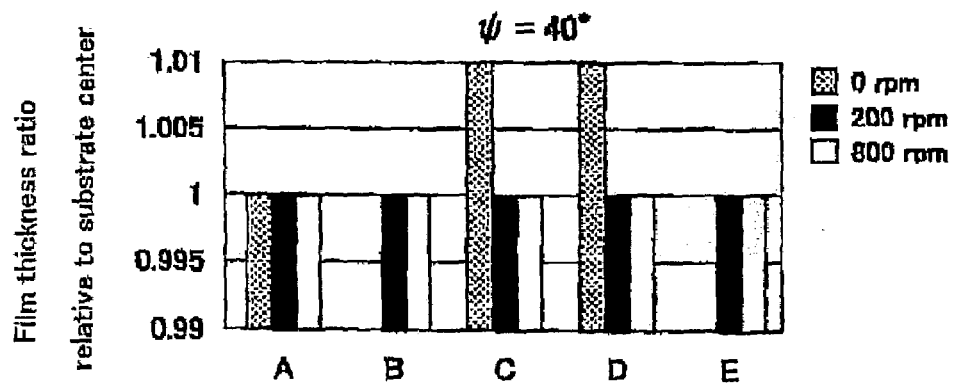
FIG. 7 is a graph for showing layer thickness deviation where deposition substrates are inclined at the inclination angle of 40 degree in the effect verification test according to the embodiment of the present invention.

Specifically, as shown in FIGS. 5 to 7, where a substrate holder 7a (deposition substrates 5) is rotated without being inclined (inclination angle Ψ=0°) and subject to film deposition, deviation of the film thickness is 0.00345 (0.345%). Meanwhile, a substrate holder 7a is inclined (inclination angle Ψ=40°) and subject to film deposition, deviation of the film thickness is remarkably reduced to be 0.00016 (0.016%), which satisfies the requirement of less than 0.1% deviation of film thickness for BRFs.

As described above, according to the present embodiment, thin film deposition on a deposition substrate 5 is performed while the deposition substrate 5 is inclined and rotated on its axis. In total, the distance from either of the deposition sources 3a1 and 3a2 to the center of the deposition substrate 5 can be approximately equal to the distance from the deposition source 3a1 or 3a2 to one edge portion of the deposition substrate 5 through rotations, which consequently makes it possible to uniformize a deposition amount over each thin film layer, that is, to achieve a uniform thickness distribution with less than 0.01% deviation, for example.

Therefore, it is possible to provide a filter which ensures a desired wavelength transmittance (loss profile) all over the filter face.

In this embodiment, the example where two deposition sources are arranged is described, however, as a matter of course, three or more deposition sources may be arranged.

Figure 8:
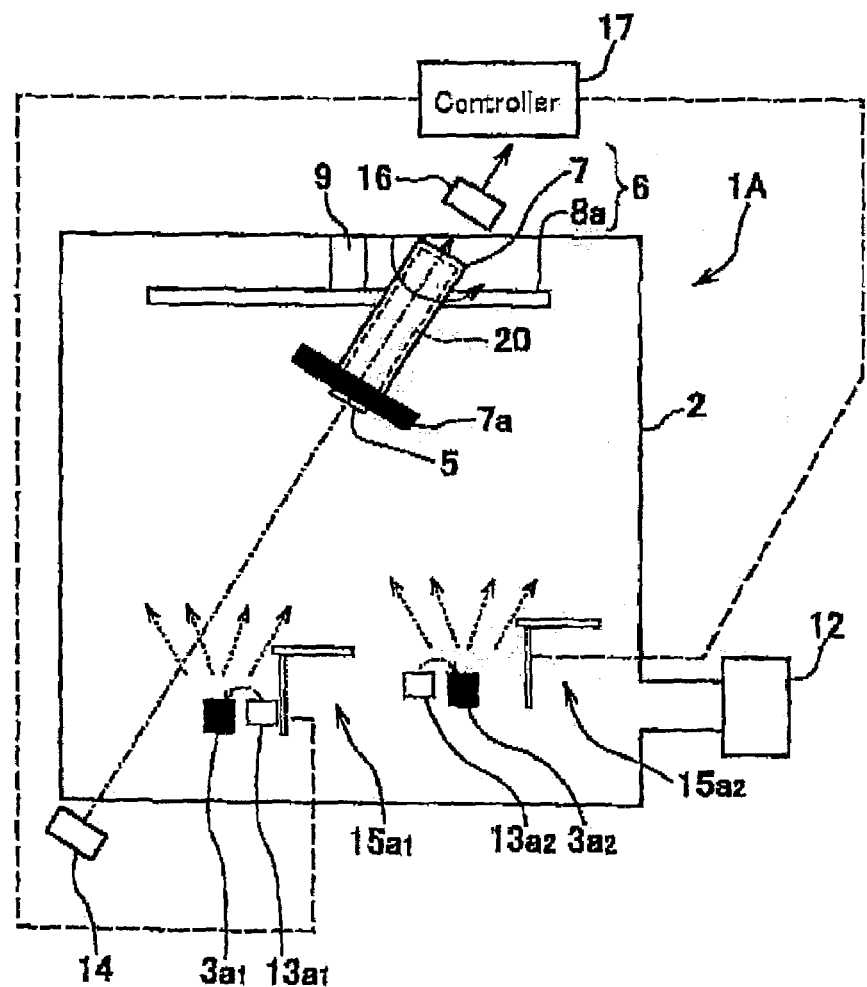
FIG. 8 is a schematic view for illustrating a configuration of a thin film deposition apparatus according to a modification of the embodiment of the present invention.

When three or more deposition sources are arranged, a substrate holder 7a may be rotated on another axis (not the axis of the substrate holder 7a) FIG. 8 is a view illustrating a thin film deposition apparatus 1A according to a modification of the first embodiment, in which three or more deposition sources are arranged.

As shown in FIG. 8, a thin film deposition apparatus 1A has a substrate holding member 6 arranged in parallel to and opposed to the horizontal plane containing each of deposition sources 3a1 and 3a2. The substrate holding member 6 is provided with a circular supporting member 8a with a plurality of fitting holes (not shown) for rigidly supporting the holder rotation support 7.

Further, the thin film deposition apparatus 1A comprises a rotation supporting member 9, connected to the circular supporting member 8a, rotatably supporting the substrate holding member 6 including the circular supporting member 8a in parallel to the horizontal plane containing the above-mentioned deposition source.

In this modification, as shown in FIG. 8, the holder rotation support 7 is fitted to one of the fitting holes of the circular support member 8a in such a manner that a substrate holder 7a of the holder rotation support 7 is inclined at the predetermined angle Ψ relative to a plane which is in parallel to the horizontal plane containing the above-mentioned deposition source.

For instance, suppose that four (first to fourth) deposition sources 3a1 to 3a4 are arranged at the same distance from the reference line LR and circumferentially spaced 90 degree from each other. First, when the substrate holder 7a (deposition substrate 5) is inclined toward the midpoint between the first and second deposition sources 3a1 and 3a2, thin film deposition is performed by deposition materials evaporated from the first and second deposition sources 3a1 and 3a2.

Then, when the circular supporting member 8a is rotated and the substrate holder 7a (deposition substrate 5) is left inclined toward the midpoint between the third and fourth deposition sources 3a3 and 3a4, thin film deposition is performed by deposition materials evaporated from the third and fourth deposition sources 3a3 and 3a4.

As a result, deposition can be performed relative to the third and fourth deposition sources 3a3 and 3a4 in the same way as the first and second deposition sources 3a1 and 3a2.

Here, the deposition sources may be rotated without rotating the circular supporting member 8a.

Rotation of the circular supporting member 8a is performed by the rotation supporting member 9 with a rotation power source such as a motor or the like. However, the rotation may be based on a manual structure such as a lever or the like if it can turn around at least 180 degree.

In arranging four deposition sources, such a configuration may be utilized that below two deposition sources, the plural (two) alternate deposition sources (crucibles) are mounted on a turning table or the like, and once the first deposition utilizing the former two deposition sources is finished, the two alternate deposition sources are then brought into use through the intermediary of the turn table. Since the deposition substrate remains always inclined at the same angle relative to the deposition sources, necessity of the rotation supporting member is eliminated.

Another embodiment of the present invention will be now described.

In a thin film deposition apparatus according to the present invention, arrangement of the deposition substrate 5 held by the substrate holder 7a and relative positions of the deposition substrate 5 and of the deposition sources 3a1 and 3a2 are different from those described in the first embodiment. Therefore, the relative positions will be mainly described below and the description of the other will be omitted or simplified.

The relative positions of the deposition substrate 5 held by the substrate holder 7a and each of the deposition sources 3a1 and 3a2 in the present embodiment, are described with reference to FIGS. 9 and 10.

Figure 9:
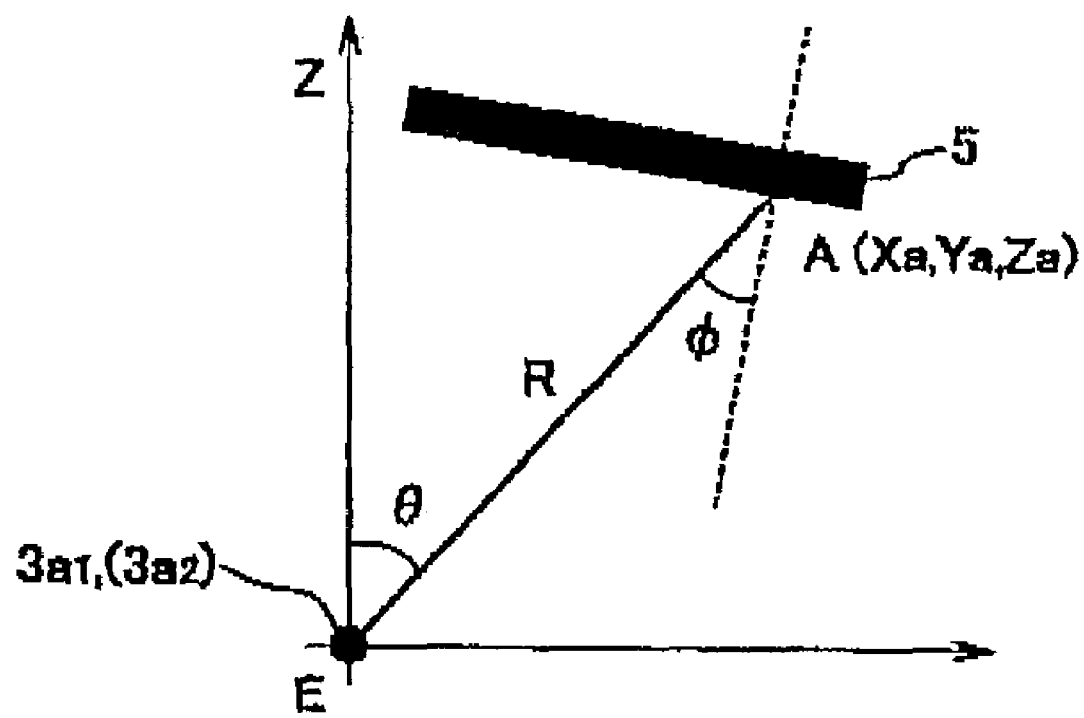
FIG. 9 shows relative positions of a deposition source and a deposition substrate supported by a substrate holder according to another embodiment of the present invention.
Figure 10:
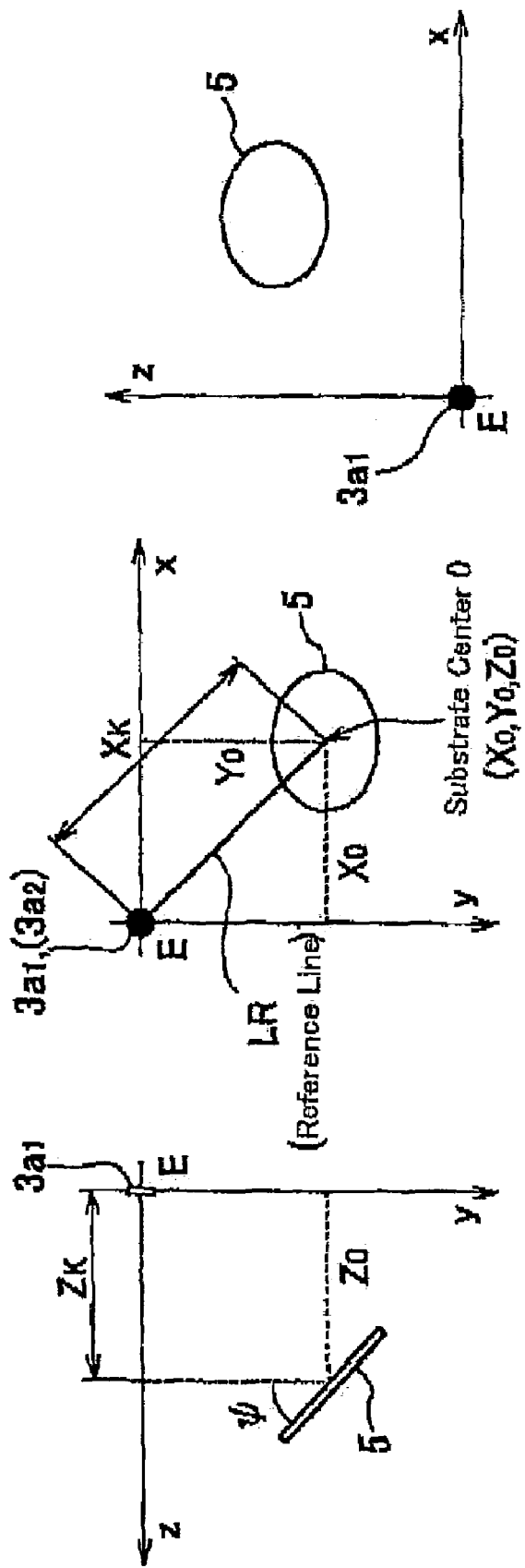
FIGS. 10A to 10C each show relative positions of a deposition source and a deposition substrate supported by the substrate holder according to the embodiment of the present invention.

Here, to simplify the description, supposing in FIGS. 9 and 10 that the horizontal plane containing one of the deposition sources 3a1 and 3a2 (horizontal plane containing the deposition source 3a1 or 3a2 when the deposition source is made closely analogous to a point and also being an evaporation surface from which a deposition material is evaporated) is the same as that of the other deposition source, the relative positions of one deposition source (e.g., deposition source 3a1) and the deposition substrate 5 will be described. However, it goes without saying that this holds true for the other deposition source 3a2.

First, it is assumed that the horizontal plane containing the deposition source 3a1 is a plane (x, y) and an axis orthogonal to the plane (x, y) is an axis z, both of which form three dimensions (x, y, z). Secondly, it is assumed that a point on the horizontal plane (evaporation surface) analogous to the deposition source 3a1 is indicated by E (0, 0, 0). The substrate holder 7a is inclined only at an inclination angle Ψ relative to the plane (x, y).

When the deposition source 3a1 is much smaller in size than the deposition substrate 5 and is closely analogous to the point (shown as E), the film thickness at a point A on the surface of the substrate 5 is represented by the following equation:

$$t=(m/\pi\delta)\times(\cos^n\theta\times\cos\phi)/R^2 \qquad (7)$$

where m, δ, R, θ, φ and n signify the following:
  m: evaporation speed (g/sec) of a deposition material
  δ: density (g/cm³) of the deposited material in a thin film
  R: distance from a point A on the deposition substrate surface to a deposition source E (0, 0, 0)
  θ: angle (rad) formed by the direction of the normal to the horizontal plane (evaporation surface) containing a deposition source and a line segment EA
  φ: angle (rad) formed by the direction of the normal to the deposition substrate surface and a line segment AE
  n: parameter indicating a distribution of a material evaporated from a deposition source Since the substrate holder 7a is inclined at the inclination angle Ψ relative to the horizontal plane (plane x-y) containing the above-mentioned deposition source, the deposition substrate is also inclined by the inclination angle Ψ relative to the horizontal plane (plane x-y) containing the above-mentioned deposition source. Accordingly, the coordinates (Xa, Ya, Za) of the point A on the deposition substrate 5 are represented by the following equations:

$$Xa=Xo+r\cos\alpha \qquad (8)$$

$$Ya=Yo+r\sin\alpha\cdot\cos\Psi \qquad (9)$$

$$Za=Zo-r\sin\alpha\cdot\sin\Psi \qquad (10)$$

where (Xo, Yo, Zo), r and a are given by:
  (Xo, Yo, Zo): coordinates of the center point O of the deposition substrate
  r: distance from the center point O of the deposition substrate to any point on the deposition substrate
  α: position in the inner radial direction of the deposition substrate Here, an angle γ formed by the line segment (ax+by+cz=d) which connects the point A to the deposition source E (0, 0, 0) and the deposition substrate plane (lx+my+nz=p) is represented by the following equation (11).

$$\cos\gamma=\{(1\cdot b-m\cdot a)^2+(m\cdot c-n\cdot b)^2+(n\cdot a-1\cdot c)^2\}^{1/2}/(a^2+b^2+c^2)^{1/2} \qquad (11)$$

The angle γ formed by the line segment AE (ax+by+cz=d) with the deposition substrate plane (lx+my+nz=p) is defined as an angle such as formed by a projection line segment of the line segment AE (ax+by+cz=d) onto the deposition substrate plane (lx+my+nz=p) and the segment line AE, and $\phi=\pi/2-\gamma$ is given in view of the definition of crossing angles.

By numerical calculations using the aforementioned equations (7) to (11), a film thickness t at the coordinates A on the deposition substrate 5 can be obtained. In an actual apparatus, as described in the first embodiment, the deposition substrate 5 is rotated on its axis at high speed so as to achieve a circumferentially uniform thickness. However, in these calculations, this thickness uniformity is addressed by averaging thickness values at the same diameter.

Figure 11:
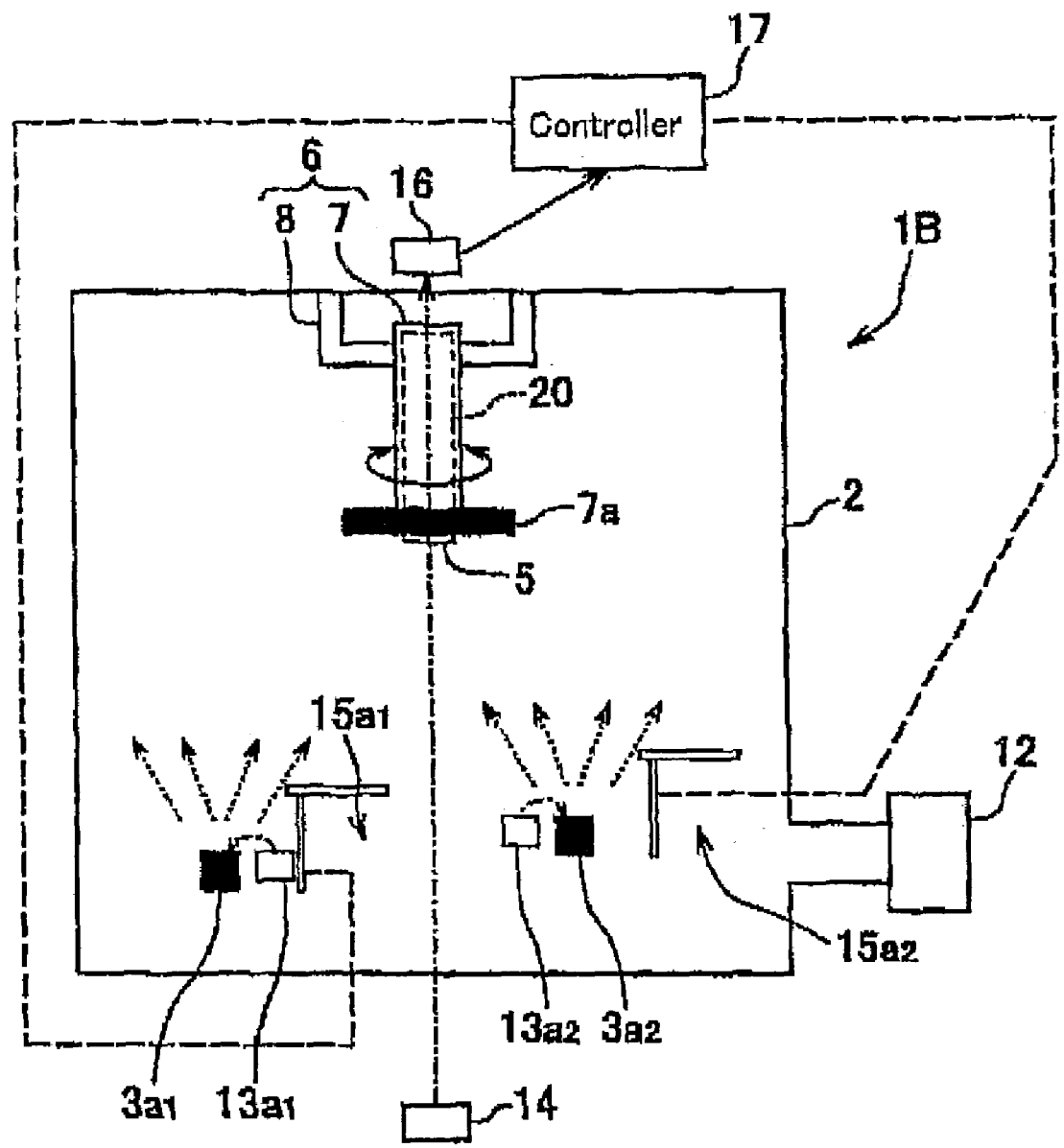
FIG. 11 is a schematic view for illustrating a configuration of a thin film deposition apparatus according to the embodiment of the present invention.

Now, in a thin film deposition apparatus 1B of the present embodiment, a holder rotation support 7 is supported by a rigid support 8 at an inclination angle $\Psi=0°$ or in such a manner that the substrate holder 7a of the holder rotation support 7 is parallel to the horizontal plane containing the aforementioned deposition source (inclination angle $\Psi=0$), as shown in FIG. 11.

In addition, in this thin film deposition apparatus 1B, given a substrate center point O of the deposition substrate 5, and a first point of intersection of the horizontal plane containing the deposition source and a reference line which passes through the deposition substrate 5 (the deposition substrate center point O) and is orthogonal to the horizontal plane, a distance from the first point of intersection to the substrate center point O is defined as Zk, and a distance from the first point of intersection to the deposition source 3a1 is defined as Xk. Based on the them, the thickness distribution was examined. Here, n equals to 1 (N=1) in the equation (7).

Figure 12:
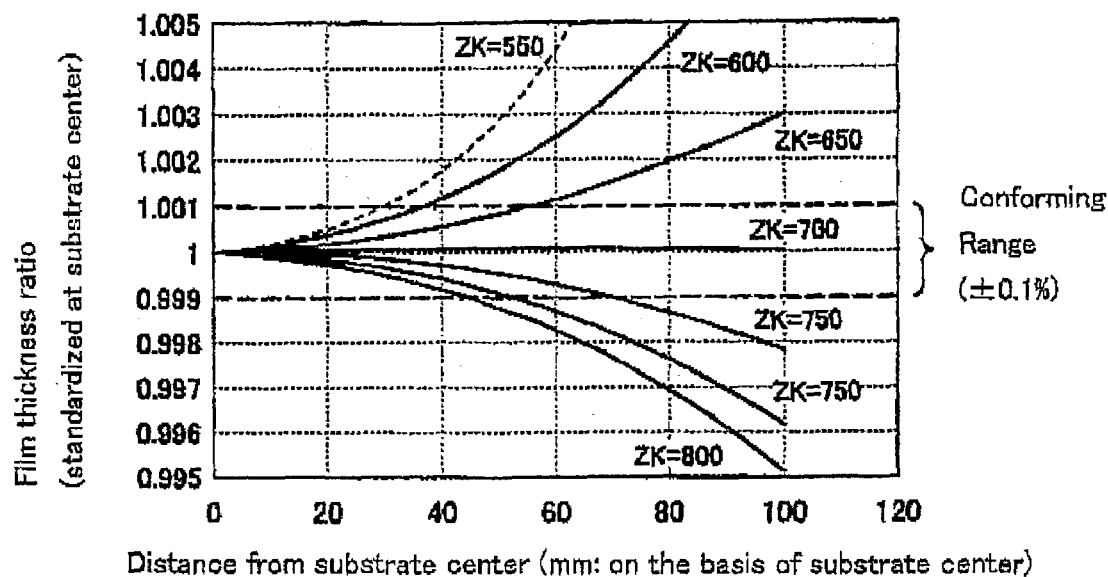
FIG. 12 is a graph for showing calculation results of the thickness distribution according to the embodiment of the present invention.

The calculation results of the above-mentioned film thickness distribution (thickness ratio) are shown in FIG. 12. Here, in FIG. 12, assuming that Xk is 500 mm (Xo=500, Yo=0), while Zk is set from 550 mm to 850 mm in 50 mm increments, the thickness ratios (standardized at the thickness of the center like in the first embodiment) were obtained.

For BPF and the like used in WDM communications, it is necessary to perform thin film deposition with high accuracy so as to have thickness distribution with less than 0.1% deviation (less than ±1.001 thickness ratio). In FIG. 12, when Zk is from 550 to 650 mm, thickness ratio is 1 or more, and a range with the thickness ratio between 1-1.001 (0.1%) inclusive ranges from the substrate center (0 mm) to only 30 mm-55 mm. When Zk is from 750 to 850 mm, thickness ratio is 1 or less, and a range with the thickness ratio between 0.999 (0.1%)-1 inclusive ranges from the substrate center (0 mm) to 40 mm or 70 mm. However, when Zk is 700 mm, according to calculations, the thickness ratio falls within ±0.1% between the substrate center (0 mm) and more than 100 mm, which shows remarkable improvement.

When the thickness distribution can be improved over the wider range, a larger product per batch can be obtained, thereby remarkably improving yields.

Figure 13:
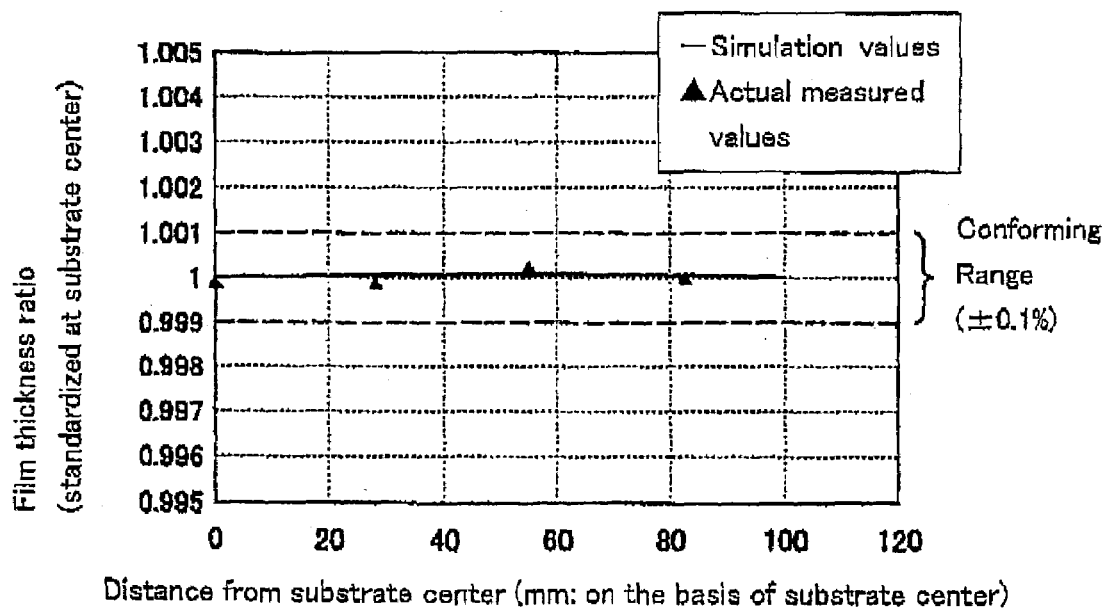
FIG. 13 is a plot of simulation values and actual measured values at $\Delta=0.71$ with $Xk=387$ mm and $Zk=545$ mm in the embodiment of the present invention.

Then, the inventors of the present invention have thought that the thickness distribution is based on the relative positions of the deposition source 3a1 and the deposition substrate 5, and have reviewed the calculation results in right of the relationship of the thickness distribution and Xk/Zk (hereinafter referred to as $\Delta$). After the review, they have confirmed that the thickness distribution can be improved best when $\Delta$ is in the vicinity of 0.71 ($\Psi=0$, n=1). Further, keeping these relative positions, they carried out the first deposition experiment utilizing an actual deposition apparatus 1B and confirmed its utility. Results of this experiment are shown in FIG. 13.

Each of the deposition sources 3a1, 3a2 and the deposition substrate is provided with a position adjusting mechanism for adjusting its position independently. More specifically, there may be provided with an adjustment jig for moving the deposition substrate 5 up and down, a moving table for moving each of the deposition sources 3a1, 3a2 up and down or from side to side.

Figure 31:
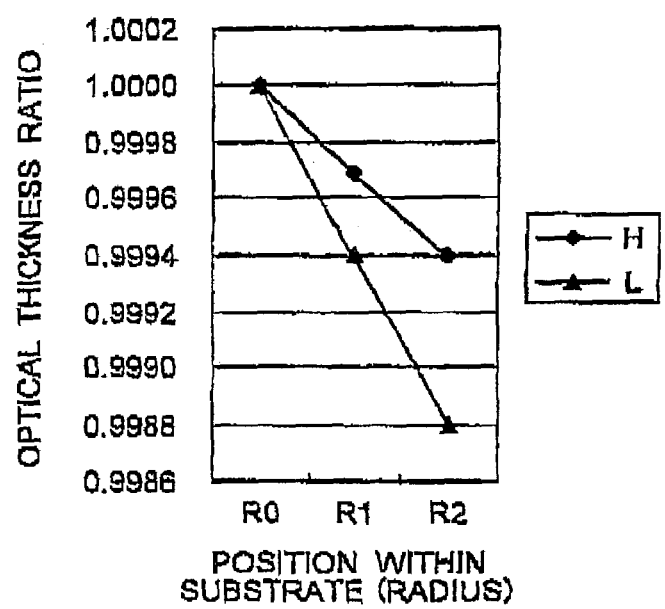
FIG. 31 is a simulation graph showing a conventional deposition thickness distribution.
Figure 32:
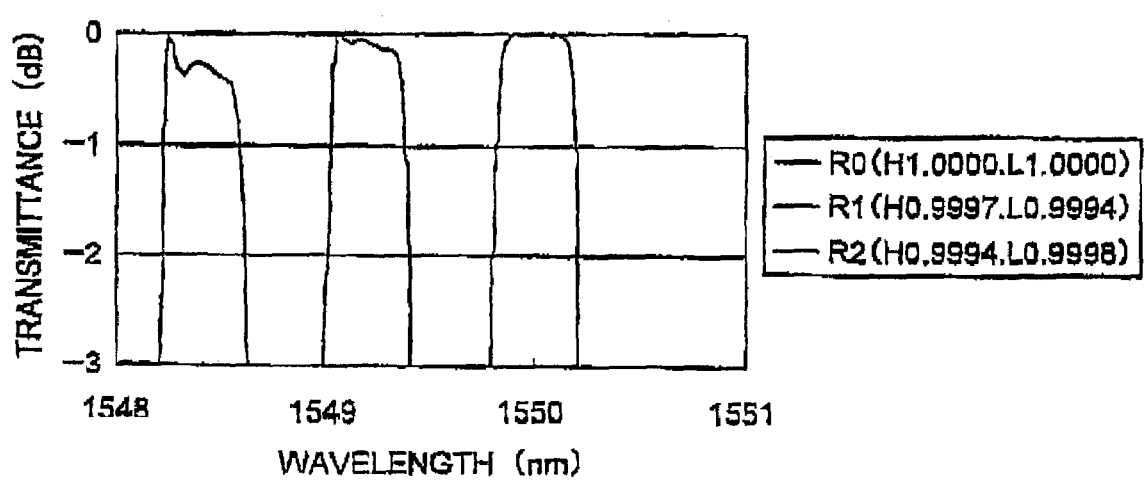
FIG. 32 is a graph showing a simulation result of a film deposition in a conventional optical film thickness distribution.
Figure 33:
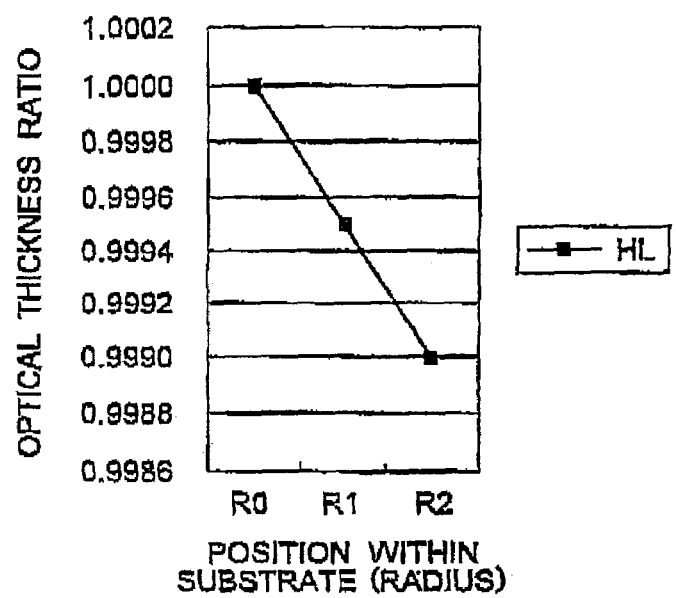
FIG. 33 is a graph showing an optical deposition thickness distribution of the present invention.
Figure 34:
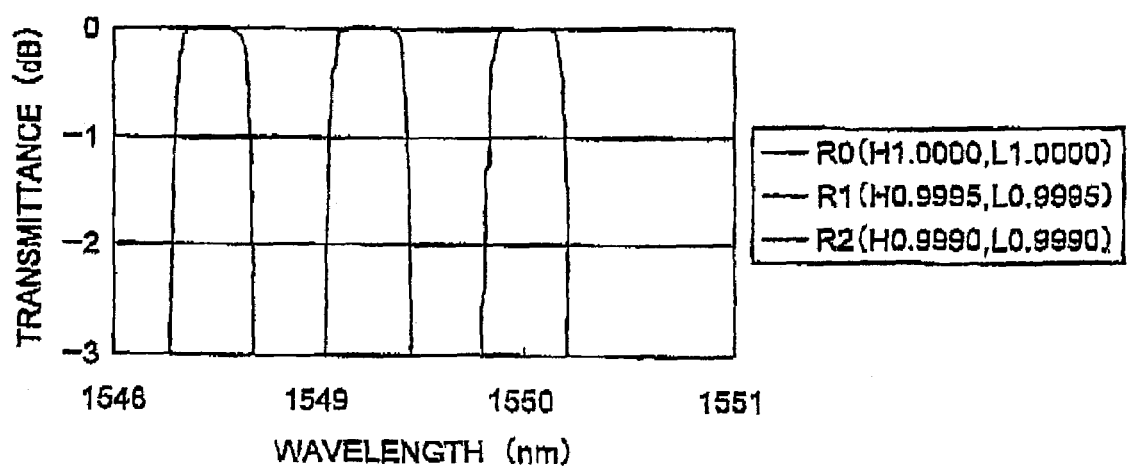
FIG. 34 is a graph showing a simulation result of a film deposition in the optical deposition thickness distribution of the invention.

Accordingly, it is possible to adjust relative positions of the deposition substrate 5 and each of the deposition sources 3a1, 3a2. As a result, since the optical deposition thickness distribution in the radial direction of the deposition substrate can be the same in H layers and L layers as shown in FIG. 33, it is possible to manufacture a BPF having an excellent loss profile only at desired wavelengths as illustrated in FIG. 34. Here, FIGS. 31 and 32 show comparative examples of FIGS. 33 and 34, respectively. FIG. 31 shows the H layers and L layers having different thickness distributions, and FIG. 32 shows characteristics of a BPF produced with a design of FIG. 31.

Figure 35:
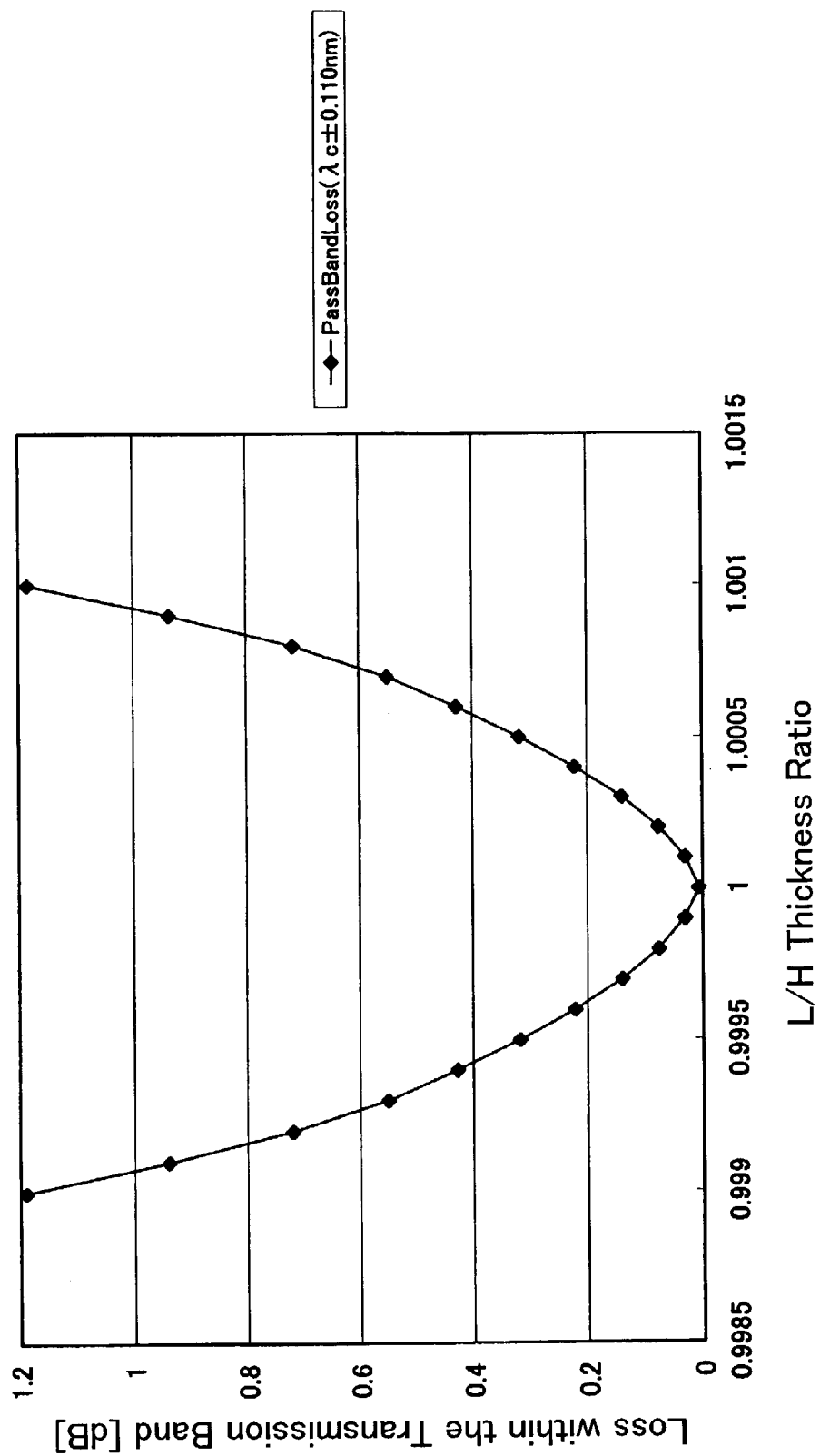
FIG. 35 is a graph of a BPF transmittance which varies depending on an H layers to L layers thickness distribution ratio.

As described above, the BPF transmittance is improved by equalizing the thickness distribution of L layers to that of H layers. FIG. 35 shows the relationship between the thickness ratio of the L layers to the H layers and the transmittance. In FIG. 35, the transmittance is shown by a loss within the transmission band. The closer the loss is to 0 dB, the more preferable the BPF transmittance becomes.

In other words, the optical thickness ratio of the L layers to the H layers has only to be determined based on a desired loss profile of BPF. For example, when the BPF loss profile within the transmission band is requested to be 0.5 dB or less, the thickness ratio of the L layers to the H layers has only to be controlled to fall within a range of from 0.9993 to 1.0007.

In order to equalize the optical deposition thickness distribution in the radial direction between H layers equal and of L layers, relative positions of each of the deposition sources and the deposition substrate are adjusted. More specifically, when $SiO_2$ is deposited as L layers, the relative positions are adjusted to meet Xk/Zk=0.71. On the other hand, when $Ta_2O_5$ is deposited as H layers, the relative positions are adjusted to meet Xk/Zk=0.6.

In adjusting of relative positions of the deposition substrate and each of the deposition sources, a position adjusting apparatus has only to be mounted on at least one of the deposition substrate and the deposition sources. A value of Xk/Zk is not limited to a value in the above example, but may be any one of various combinations. For example, when $SiO_2$ is deposited as L layers, the relative positions are adjusted to meet Xk/Zk=0.57 and when $Ta_2O_5$ is deposited as H layers, the relative positions are adjusted to meet Xk/Zk=0.55 so as to obtain the same results as shown in FIGS. 33 and 34.

Figure 2:
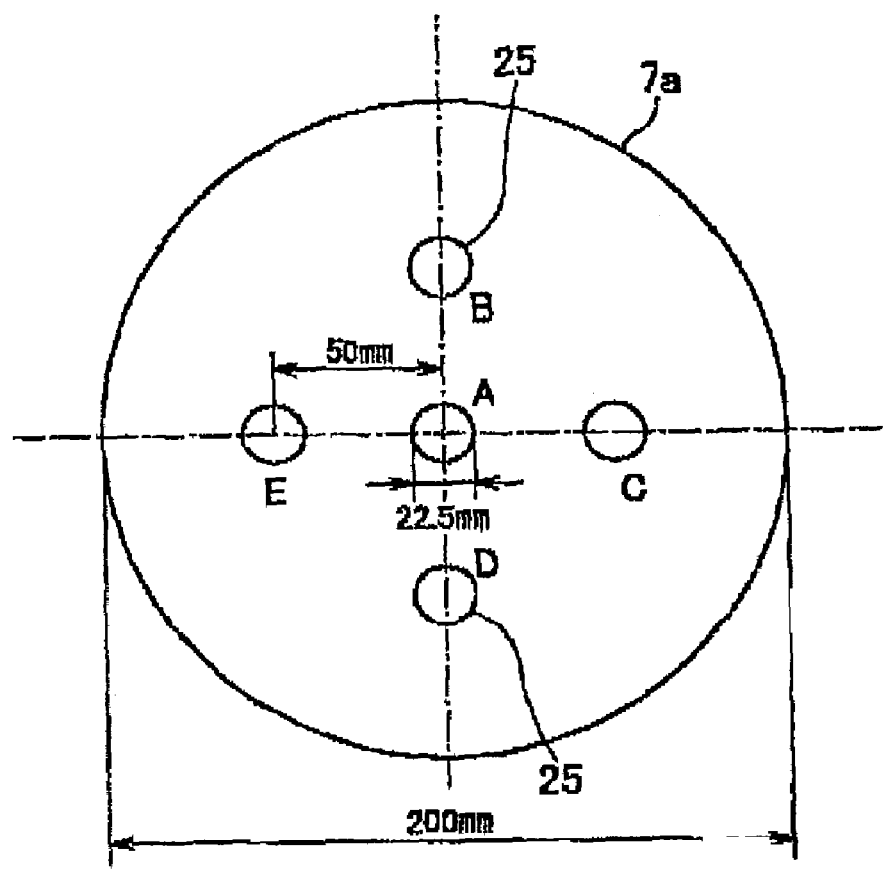
FIG. 2 is a view for showing an example of a substrate holder according to the embodiment of the present invention.
Figure 14:
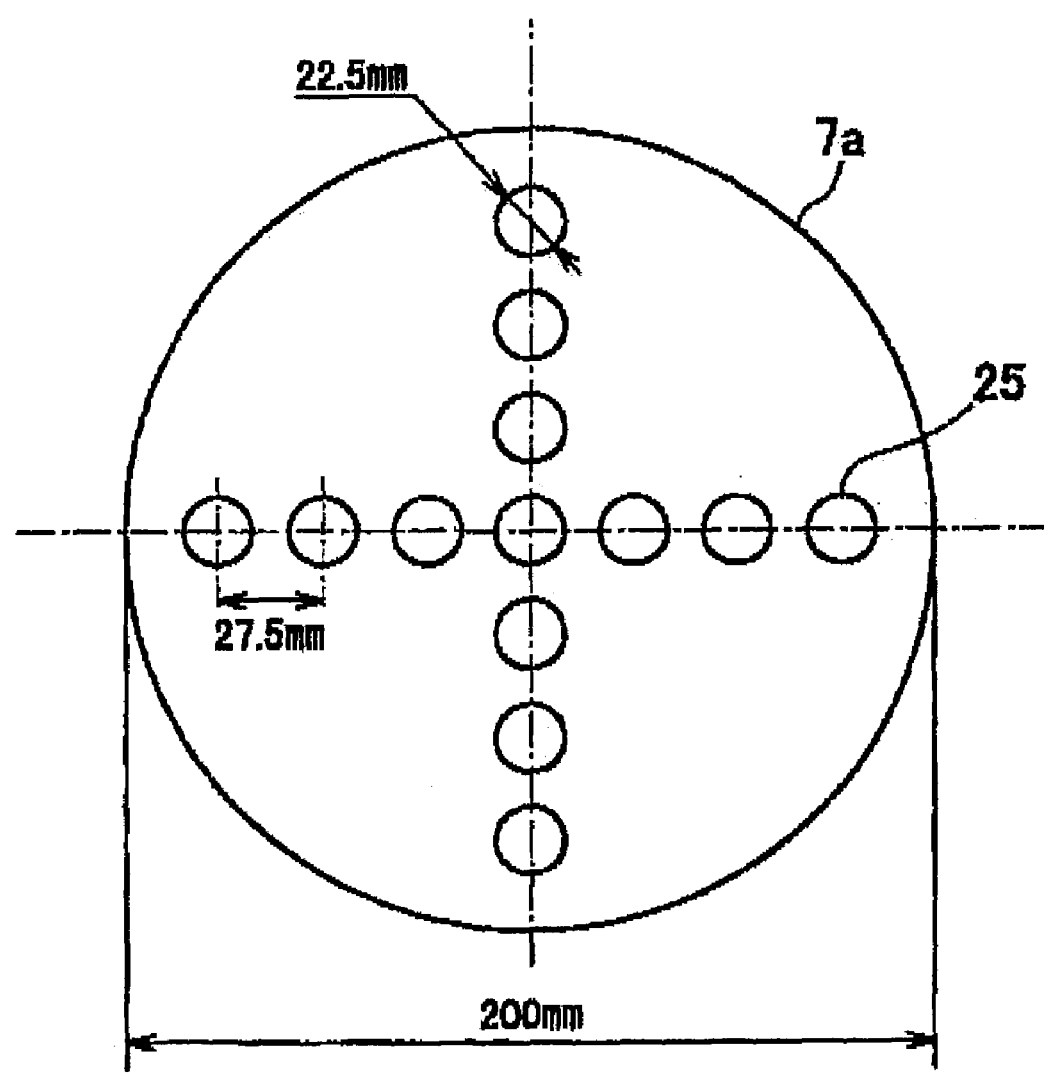
FIG. 14 is a schematic view for showing a configuration of a sample substrate according to the embodiment of the present invention.

FIG. 13 shows the plot of the calculation results (simulation values) and the experimental results (actual measured values) at $\Delta=0.71$ with Xk=387 mm and Zk=545 mm. Like in the aforementioned embodiment of the present invention, $SiO_2$ was used as a deposition material. In this experiment, vacuum level in the vacuum chamber 2 was set $10^{-2}$ Pa and the deposition rate was 5 Å/second, and thirteen sample deposition substrates 5 were arranged in a fixed experimental substrate holder 7a (which is the same as that in FIG. 2 of the one embodiment of the present invention) being spaced a predetermined interval (27.5 mm) apart in the diameter and spaced 90 degree apart circumferentially (Refer to FIG. 14). Then, optical thickness was measured using a controller 17 via a photoreceiver 16. After the measurement, optical film thickness values on the sample deposition substrates 5 arranged along the same circumference (spaced uniformly from the center substrate) were averaged to calculate a thickness ratio.

In FIG. 13, it has been shown that the thickness distributions of the measured values fall within ±0.1% of the thickness ratio at Δ=0.71. It has been also shown in FIG. 13 that Xk and Zk differently combined but having the same Δ offer the same effect on improvement of the thickness distributions. As seen from comparison between the experimental results (actual measured values) and calculation results (simulation values), both of the results are approximately the same, and therefore, validity of the calculation model has been verified.

Figure 15:
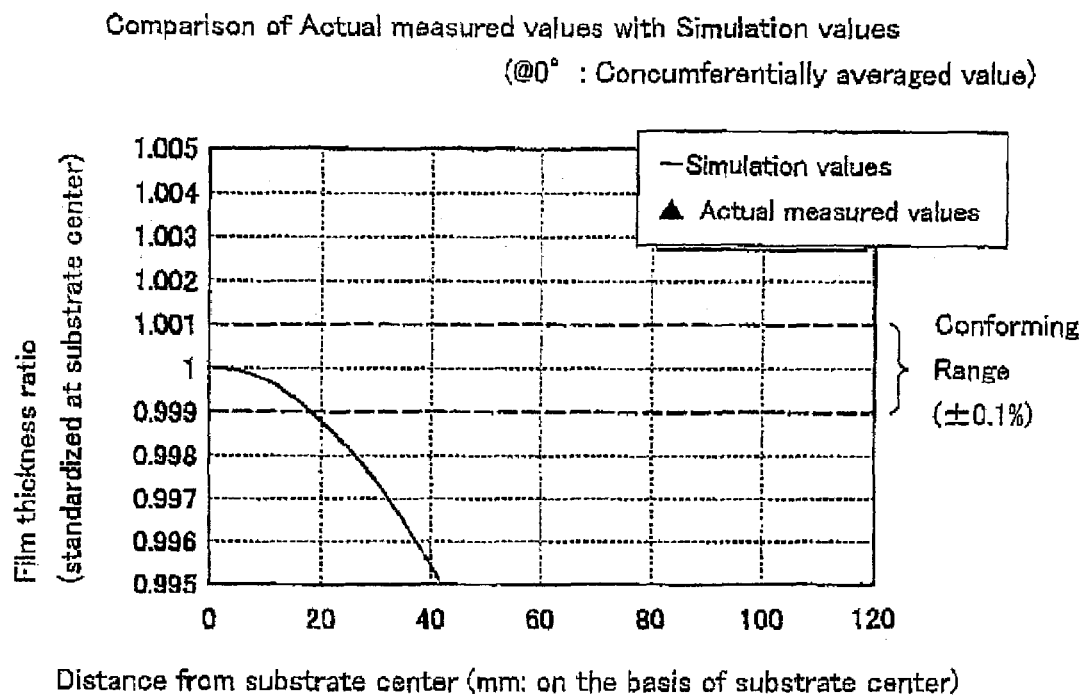
FIG. 15 is a graph of simulation results and actual measured values of thickness ratios where deposition substrates are arranged being inclined at the inclination angle $\Psi$ of 0 degree with $\Delta=0.44$ ($Xk=240$ mm, $Zk=545$ mm) in the embodiment of the present invention.
Figure 16:
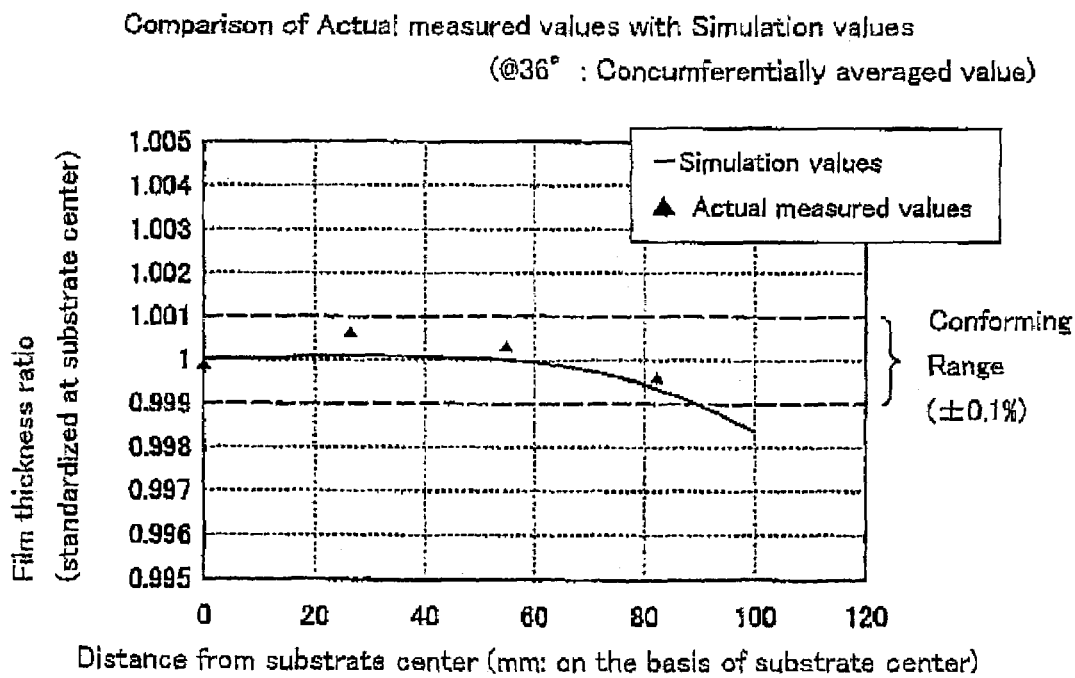
FIG. 16 is a graph of simulation results and actual measured values of thickness ratios where deposition substrates are arranged being inclined at the inclination angle $\Psi$ of 36 degree with $\Delta=0.44$ ($Xk=240$ mm, $Zk=545$ mm) in the embodiment of the present invention.

Next, using a deposition apparatus 1C in which deposition substrates 5 are inclined (at the inclination angle Ψ) as is the case in the first embodiment, variation of thickness distributions was examined. FIG. 15 is a graph of calculation results (simulation results) and experimental results (results of the second deposition experiment) both of thickness ratios where the deposition substrates are not inclined (the inclination angle Ψ=0°) and arranged at Δ=0.44 (Xk=240 mm, Zk=545 mm). Further, FIG. 16 is a graph of calculation results (simulation results) and experimental results (results of the second deposition experiment) both of thickness ratios where the deposition substrates are inclined at 36 degree of the inclination angle Ψ and arranged at Δ=0.44 (Xk=240 mm, Zk=545 mm). Here, the experimental conditions are the same as those in the aforementioned first disposition experiment).

As shown in FIG. 15, when the substrates are not inclined, the thickness distribution falls less than 0.999 in the vicinity of 20 mm from the substrate center. In addition, as shown in FIG. 16, when the deposition substrate is inclined at 36 degree (Ψ=36°), the thickness distribution falls less than 0.999 at 90 mm from the substrate center. These show that the inclination angle (Ψ) of the deposition substrate is also conductive to improvement of the thickness distribution as well as the relative positions of the deposition substrates and deposition source.

When the distribution of deposition material (evaporated material) varies dependent on deposition apparatuses, optimal Δ and inclination angles are thought to also vary dependent on deposition apparatuses. The distribution of deposition material (evaporated material) can be expressed by the term of $\cos^n \theta$ of the equation (7) where the angle formed by the direction of the normal of the evaporation surface and the line segment EA is θ. Although the distribution of material evaporation depends on material melting means and apparatuses, n appropriately ranges from 1 to about 4 for electron beam deposition by electron guns 13a1 and 13a2 as shown in FIG. 1.

Figures 17A, 17B:
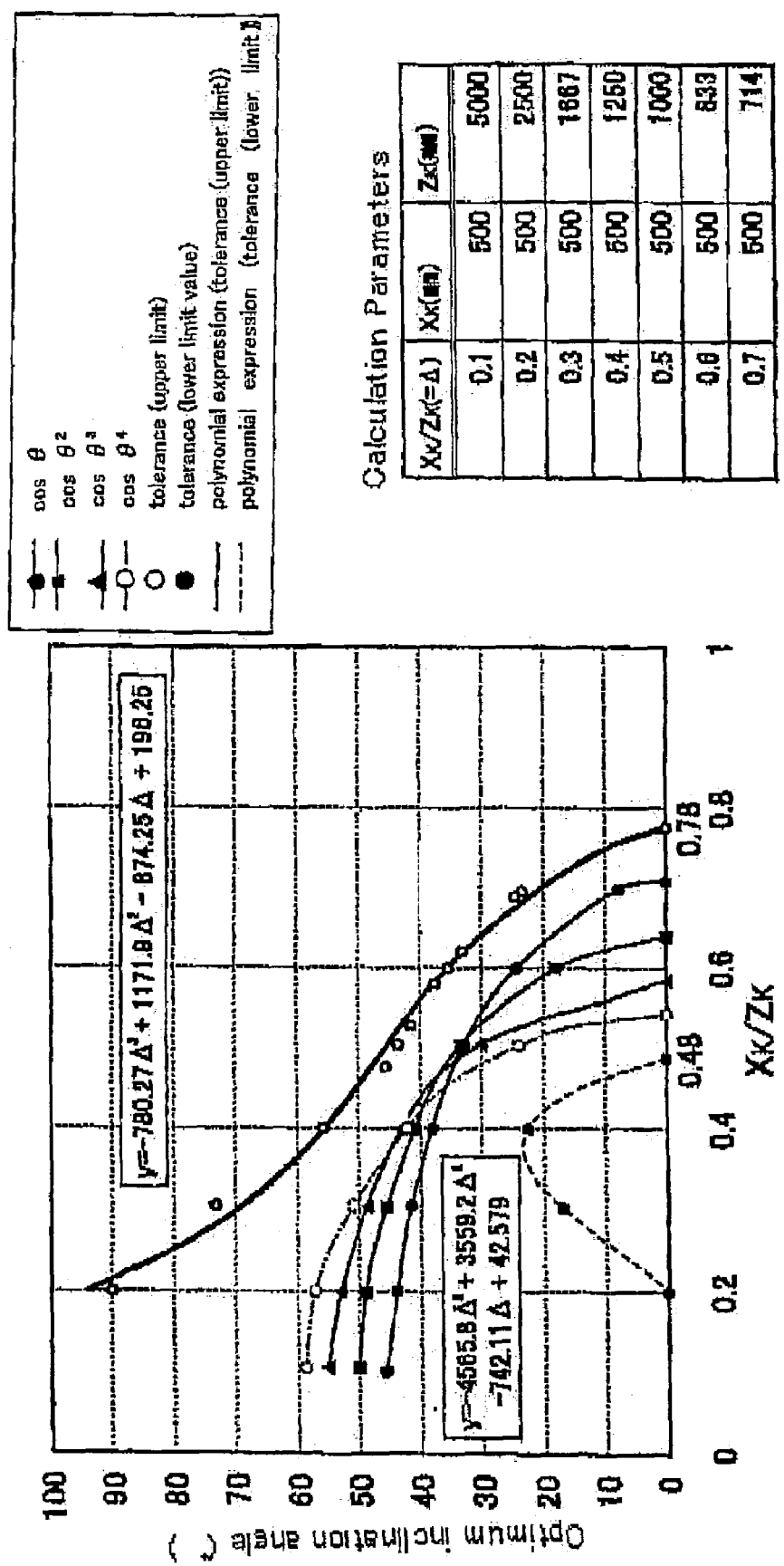
FIG. 17A is a graph of calculation results of $\Delta$ and inclination angle such as obtained when the thickness error (difference) between the thickness of the deposition substrate center and that of a position in the radial direction from the deposition substrate center is minimalized for each distribution of the material evaporation in the embodiment of the present invention.
FIG. 17B is a table of parameter values in the above-mentioned calculation process.
Figure 18:
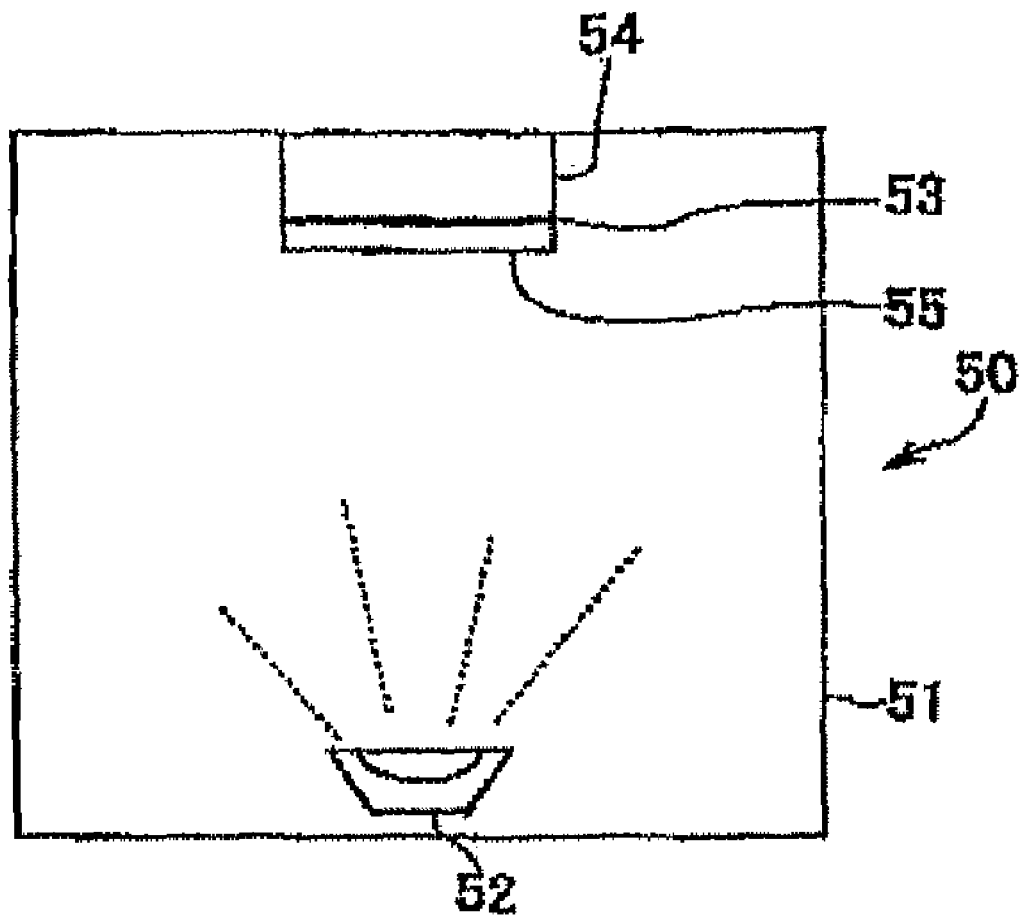
FIG. 18 is a brief block diagram for illustrating a configuration of a conventional thin film deposition apparatus.

Then, based on the equation (7), a Δ and an inclination angle were calculated such as obtained when a difference (thickness error) between the thickness at the deposition substrate center and the thickness at a point apart (in the radial direction) from the center of the substrate deposition is minimized for each distribution ($\cos \theta$ to $\cos^4 \theta$). The obtained calculation results are shown in FIGS. 17A and 17B. Here, in these calculations, Δ (Xk is fixed at 500 mm) is set as a variable (parameter; refer to FIG. 17B) for each distribution (n), and evaluated by using a value obtained by multiplying the error by itself as a calculating method of an inclination angle.

As seen from FIG. 17A, the optimal relationship of the substrate position (Δ) and the deposition substrate inclination angle is plotted in an elliptic curve. Specifically, as shown in FIG. 17A, when the substrate inclination angle is 0 degree, improvement of the thickness distribution for each distribution of material evaporation can be expected by arranging a substrate and a deposition source in such a manner that Δ falls between 0.48 and 0.78. Where Δ is less than 0.2, the same effect can be expected, however, it is necessary to lengthen the distance Zk from the center of the deposition substrate 5 to the first point of intersection of the horizontal plane containing a deposition source and a reference line which passes through the center of the deposition substrate and is orthogonal to the horizontal plane. When the distance Zk is longer, the deposition rate becomes smaller, which is not realistic.

In addition, when the distance Xk from the first point of intersection to the deposition source 3a1 is shortened, Δ can be smaller. However, in this situation, the incident angle θ of particles which are deposited onto the substrate becomes smaller, which produces little effect on the improvement of the thickness distribution. A practical distance Xk is more than 200 mm.

As described above, in this embodiment, the thickness distribution can be improved by adjusting, for each distribution of a material evaporation, the relative positions of a substrate and a deposition source and the inclination angle Ψ of the substrate so as to fall within the range shown in the equations (12) and (13) below:

$$-4565.8 \cdot (Xk/Zk)^3 + 3559.20 \cdot (Xk/Zk)^2 - 742.11 \cdot (Xk/Zk) + 42.58 \leq \Psi \leq 780.27 \cdot (Xk/Zk)^3 + 1171.9 \cdot (Xk/Zk)^2 674.25 \cdot (Xk/Zk) + 186.25 \quad (12)$$

$$-780.27 \cdot (Xk/Zk)^3 + 1171.9 \cdot (Xk/Zk)^2 - 674.25 \cdot (Xk/Zk) + 186.25 \quad (13)$$

where Xk/Zk in the equation (12) satisfies 0.2≦Xk/Zk<0.48 and Xk/Zk in the equation (13) satisfies 0.48≦Xk/Zk≦0.78.

However, the relative positions of the deposition source 3a1 and the deposition substrate 5 as described in another embodiment of the present invention are not for limiting the present invention. When relative positions of the deposition source 3a2 and the deposition substrate 5 are set in the same way as those of the deposition source 3a1 and the deposition substrate 5, the same effect can be achieved.

Further in the embodiment, though the horizontal plane (evaporation surface) of the deposition source 3a1 is set to be the same as that of the deposition source 3a2, this is not for limiting the present invention. The horizontal planes of the respective deposition sources may be different from each other.

In this situation, given the first points of intersection of the horizontal plane containing each of the deposition sources 3a1 and 3a2 and a reference line which passes through the deposition substrate 5 (the substrate center point) and is orthogonal to the horizontal plane, the distances from the first points of intersection to the substrate center of the deposition substrate 5 are defined as Zk1 and Zk2, respectively, and the distances form the first points of intersection to the deposition sources 3a1 and 3a2 are defined as Xk1 and Xk2, respectively. Then, Δ=(Xk/Zk) can be expressed by Δ1=Xk1/Zk1 and Δ2=Xk2/Zk2 for the deposition sources 3a1 and 3a2, respectively.

Then, when the deposition sources 3a1 and 3a2 and the deposition substrate 5 are arranged in such a manner that Δ1 and Δ2 in Δ1=Xk1/Zk1 and Δ2=Xk2/Zk2 fall between 0.48 and 0.78 for the deposition sources 3a1 and 3a2, respectively, and an effect on improvement of the thickness distribution can be expected for each of the above-mentioned distributions of material evaporations.

Further, the deposition sources 3a1 and 3a2 and the deposition substrate 5 are arranged in such a manner that Δ1 and Δ2 in Δ1=Xk1/Zk1 and Δ2=Xk2/Zk2 for the deposition sources 3a1 and 3a2, respectively, satisfy the equations (12) and (13), thereby contributing to the aforementioned improvement of the thickness. The same goes for a case of three deposition sources being used.

Furthermore, where a plurality of thin film substrates 5 are provided, it is only necessary that a deposition source is arranged relative to each of the substrates so as to establish the above-mentioned positional relationship.

In the one embodiment and other embodiment of the present invention as described above, a vapor deposition system by electron beams emitted from electron guns is used as a deposition system. However, this is not for the purpose of limiting the present invention. For example, another deposition means such as a sputtering system may be used if a deposition source thereof is so small to be analogous to a point and a distribution of a deposition material is applicable.

Further, in the one embodiment and another embodiment of the presemt invention as described above, the substrate holder 7a is rotated about a rotational axis which passes through the center of the substrate and is orthogonal to the holder 7a. However, this is not for the purpose of limiting the present invention. The substrate holder 7a may be rotated about a rotary axis which passes through a part of the substrate and is orthogonal to the holdig plate. In addition, rotation is not limited to that in one direction, but may be in two directions in turn, in orther words, be like swinging.

As described above, since a thin film deposition method and a thin film deposition apparatus in accordance with the present invention enable deposition onto a deposition substrate to be performed while the deposition substrate is inclined and rotated. Accordingly, the distance from a deposition source to the deposition substrate center can be approximately equal to the distance from the deposition source to one edge of the deposition substrate totally through rotations. This allows the deposition amount of each deposited thin film, that is, thickness distribution to be uniform over a film layer, thereby providing a filter with optical characteristics uniform all over the filter.

Further according to the present invention, by setting relative positions of a deposition substrate and a deposition source, and an inclination angle of the substrate within respective predetermined ranges, it is possible to produce an optical multilayer thin film large in size with almost no variation in thickness distribution.

Then, there are shown examples of a method for controlling a temperature of the deposition substrate surface to make uniform the deposition amount of the deposition material, i.e., deposition thickness on the surface of the deposition substrate. In this example, the deposition substrate is heated by a heating source such as a heater to produce a temperature distribution on the deposition substrate surface. In general, a temperature of the deposition substrate surface is to be made higher at the portion in which a deposition thickness becomes large so that a re-evaporation of the deposited material is accelerated to make the deposition thickness relatively thin so as to make the deposition thickness uniform all over the deposition substrate.

Figure 19:
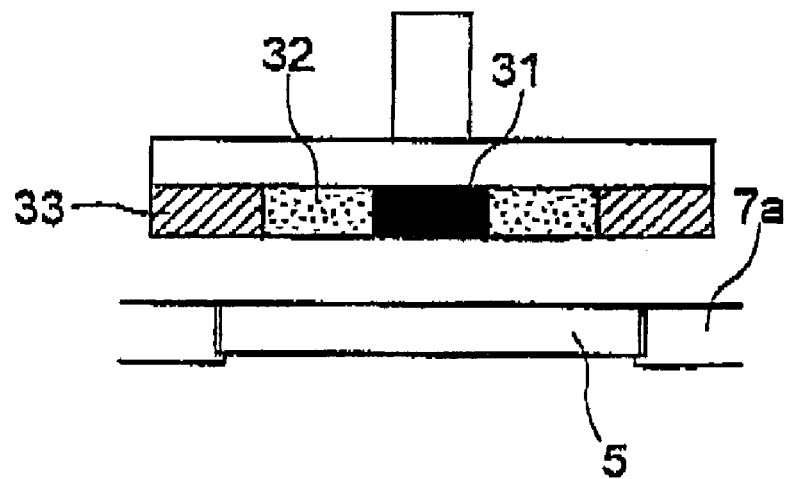
FIG. 19 is a schematic view of a heating apparatus to provide a temperature distribution with the deposition substrate.
Figure 20:
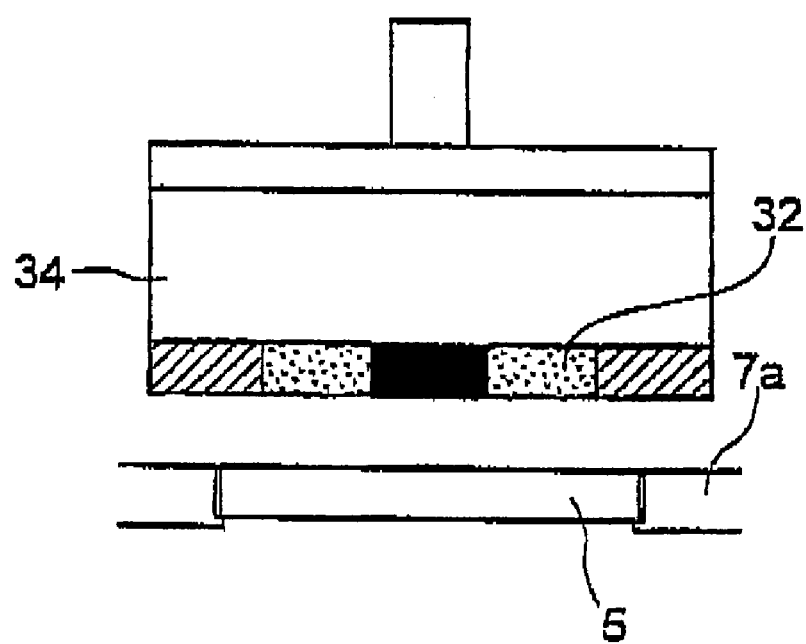
FIG. 20 is a schematic view of a heating apparatus enabling to adjust a distance between the heating apparatus and the deposition substrate.

The example is described in detail with reference to the drawings. FIG. 19 shows a portion of the heating apparatus having three kinds of the heating sources 31, 32, 33 above the deposition substrate 5 to control the temperature distribution of the deposition substrate. FIG. 20 shows another heating apparatus which includes a position adjusting apparatus 34 to adjust the position of the heating sources to enable to adjust a distance between the deposition substrate and the heating sources.

Figure 21:
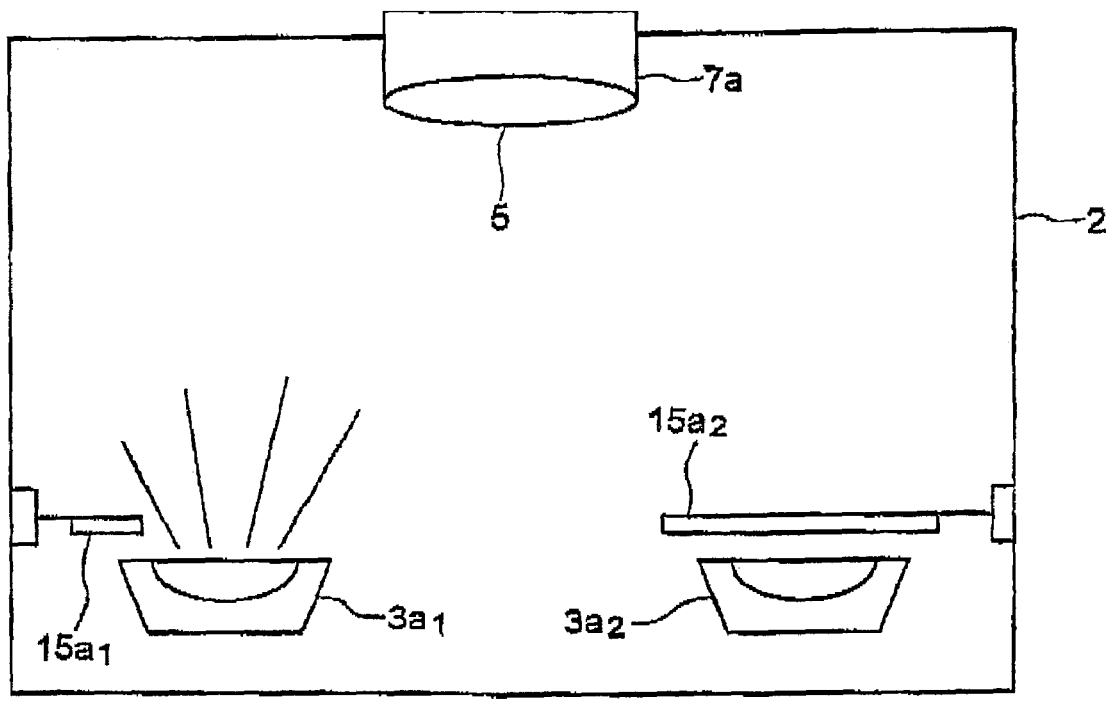
FIG. 21 is a schematic view of a film deposition apparatus including a heating apparatus.

FIG. 21 schematically shows a film deposition apparatus as the example. The film deposition apparatus of the invention comprises a vacuum chamber 2, a substrate holder 7a for holding the deposition substrate 5 in the vacuum chamber 2, two deposition sources 3a1, 3a2 arranged in the vacuum chamber 2 below the substrate holder 7a, and shutters 15a1, 15a2 for shutting off the deposition material from the deposition source. The substrate holder 7a may have a rotational mechanism.

Figure 22:
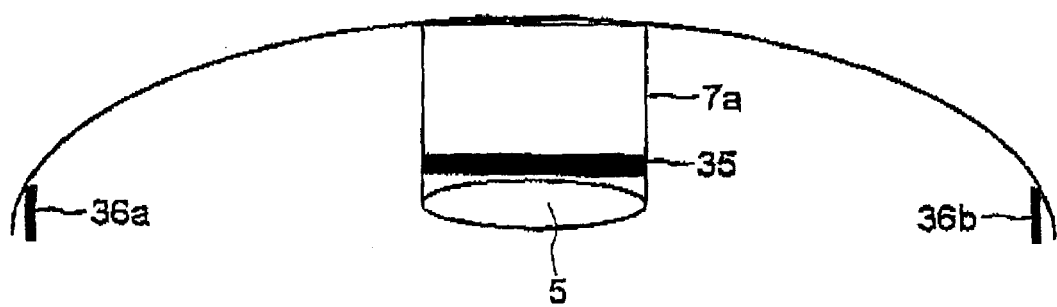
FIG. 22 is a schematic view of a deposition substrate heater.

Furthermore, as depicted in FIG. 22, heaters are arranged for heating the deposition substrate at the upper-lateral sides of the vacuum chamber and directly above the deposition substrate. The heating temperature of each of the heaters is to be separately arranged.

Figure 23:
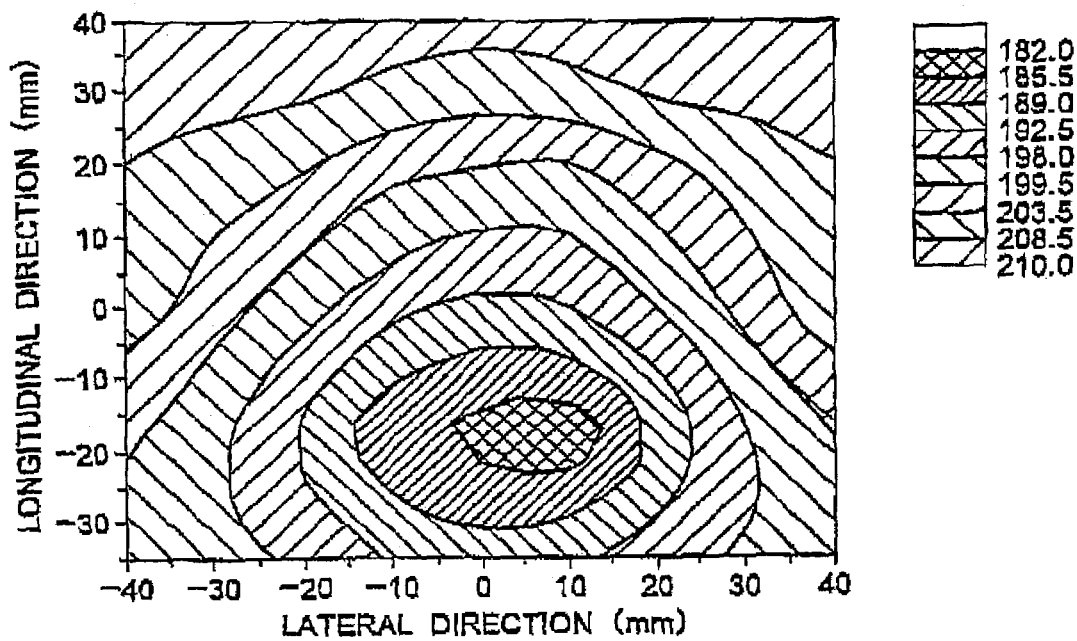
FIG. 23 is a diagram showing a temperature distribution of the deposition substrate in case that the temperature of the heater is set to be 330 degree centigrade.

When the heater directly above the deposition substrate is arranged to be 330 degree Celsius without rotating the deposition substrate, and the upper-lateral heaters are arranged to be 200 degree Celsius and the deposition substrate is fully heated, the temperature distribution of the deposition substrate becomes as shown in FIG. 23. When the temperature is averaged in a diameter direction of the deposition substrate, the temperature at the center of the deposition substrate is 192.5 degree Celsius while the temperature 30 mm apart from the center of the deposition substrate is 198.5 degree Celsius, which is 6.0 degree Celsius higher than the temperature at the center of the deposition substrate.

Figure 24:
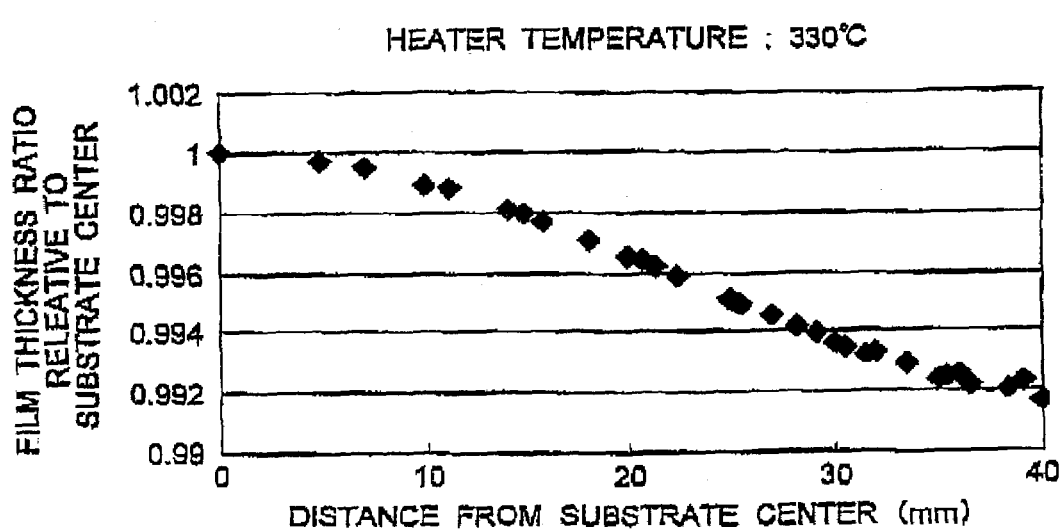
FIG. 24 is a diagram showing a deposition thickness distribution of the deposition substrate in case that the temperature of the heater is set to be 330 degree centigrade.

A distance between the deposition substrate and the plane containing the deposition source is arranged to be 800 mm, and the distance between the rotational axis of the deposition substrate and the deposition source is arranged to be 500 mm, and then a silicon dioxide ($SiO_2$) is deposited with rotating the deposition substrate, and with the heaters arranged by the above mentioned temperatures. FIG. 24 shows a thickness distribution of each portion on the deposition substrate when deposition is performed under the above-mentioned conditions. In FIG. 24, the thickness distribution is represented with the center of the deposition substrate being 1 as a reference. The film thickness ratio at the position 30 mm apart from the center of the deposition substrate becomes 0.9936 with the center of the substrate being 1.

Figure 25:
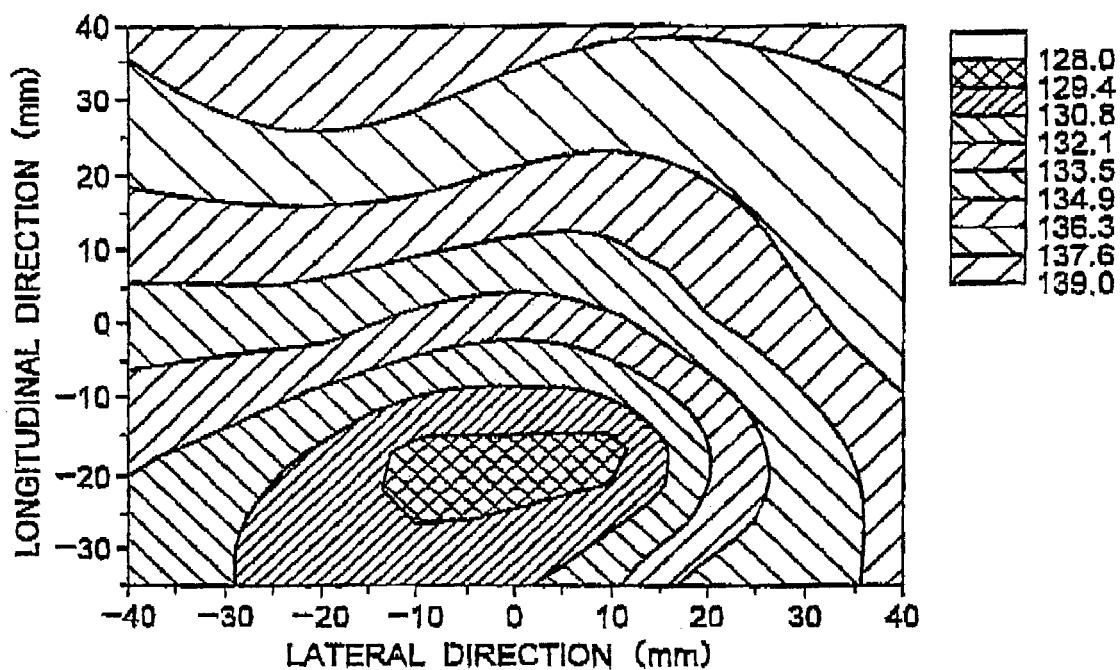
FIG. 25 is a diagram showing a temperature distribution of the deposition substrate in case that the temperature of the heater is set to be 256 degree centigrade.

Then, when the heater directly above the substrate is rearranged to be 256 degree Celsius, and the upper-lateral heaters are rearranged to be 200 degree Celsius and the deposition substrate is fully heated without rotating the deposition substrate, the temperature distribution of the deposition substrate becomes as shown in FIG. 25.

Figure 26:
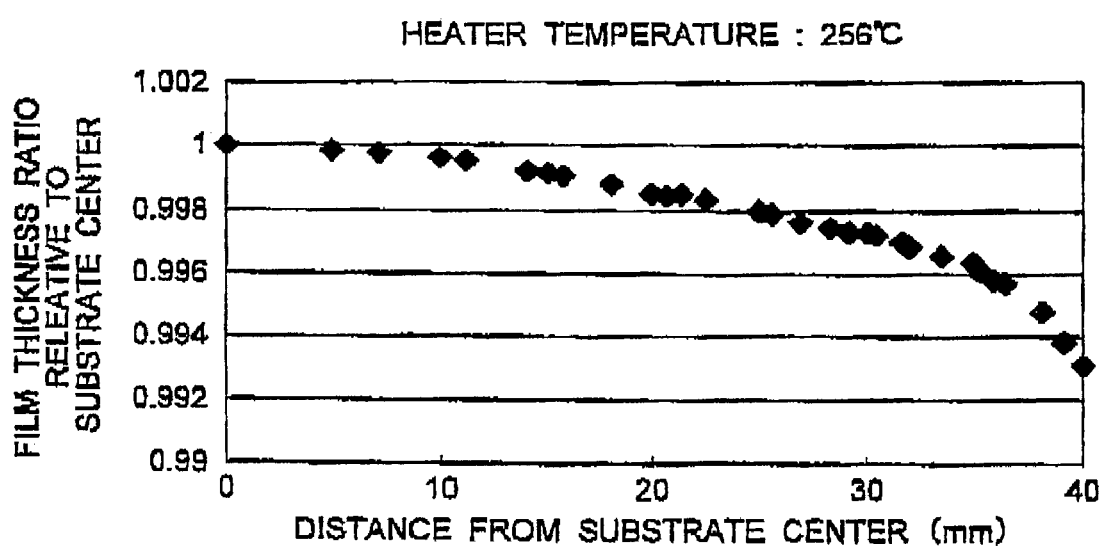
FIG. 26 is a diagram showing a deposition thickness distribution of the deposition substrate in case that the temperature of the heater is set to be 256 degree centigrade.

When the temperature is averaged in a diameter direction of the deposition substrate, the temperature at the center of the deposition substrate is 133.0 degree Celsius while the temperature 30 mm apart from the center of the substrate is 134.3 degree Celsius, and in short, a difference between the temperatures is 1.3 degree Celsius. A silicon dioxide is deposited with rotating the substrate. The thickness distribution represented with the center of the substrate being 1 as a reference is changed as shown in FIG. 26. The film thickness ratio at the position 30 mm apart from the center of the substrate becomes 0.9973 with the center of the substrate being 1.

As a result, by means of the temperature control of the temperature difference between the center of the deposition substrate and the portion 30 mm apart from the center of the deposition substrate to be from 6.0 to 1.3 degree Celsius, the deviation of the film thickness ratio at the portion 30 mm apart from the center of the deposition substrate can be improved from 0.0064 to 0.0027.

Figure 27:
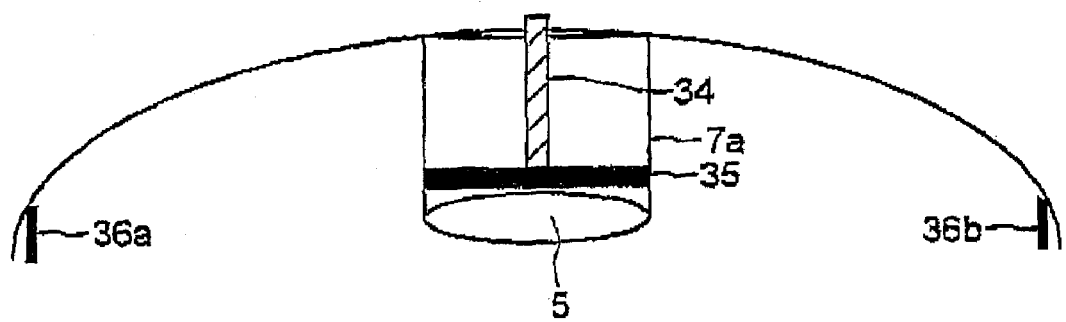
FIG. 27 is a schematic view showing a position adjustment between the deposition substrate and the heater.

FIG. 27 shows a film deposition apparatus which has a position adjusting mechanism 34 to adjust a distance between the deposition substrate 5 and the heater 35. The distance between the deposition substrate 5 and the heater 35 is arranged to be 10 mm. In this case, the heater directly above the deposition substrate is rearranged to be 330 degree Celsius and the upper-lateral heaters 36a, 36b are rearranged to be 200 degree Celsius, and then, the substrate is fully heated without rotating the substrate. The temperature distribution of the deposition substrate becomes as shown in FIG. 23. The temperature at the center of the deposition substrate is 92.5 degree Celsius while the temperature at the position 30 mm apart from the center of the deposition substrate is 198.5 degree Celsius.

Figure 28:
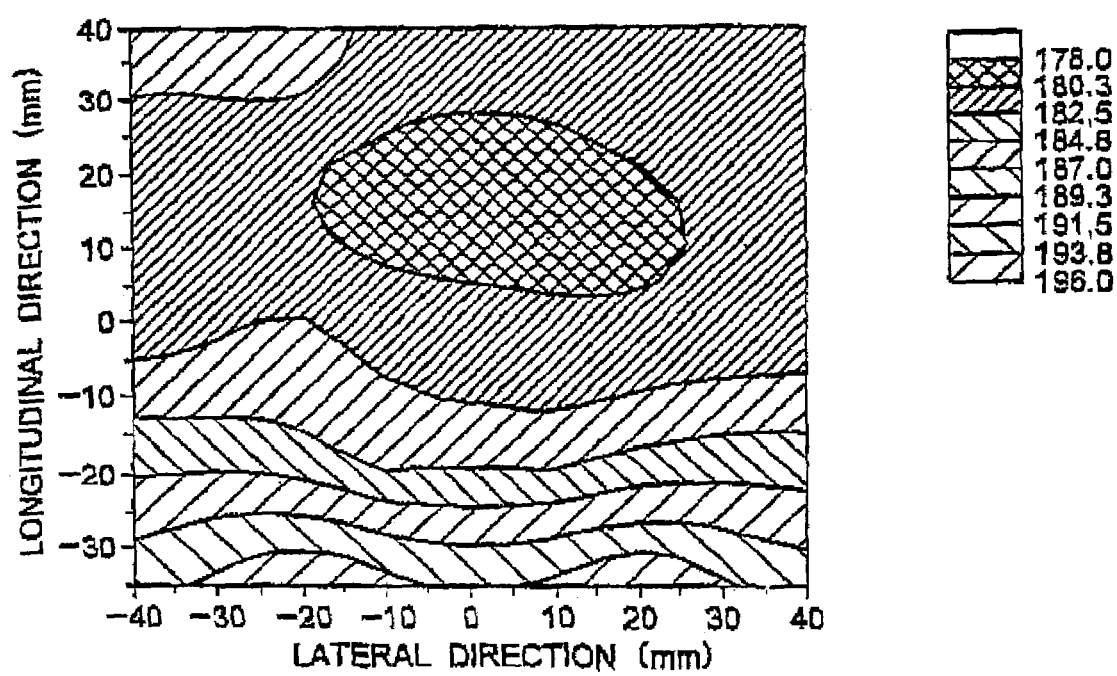
FIG. 28 is a diagram showing a temperature distribution of the deposition substrate in case that the distance between the deposition substrate and the heater is 35 mm.

On the contrary, the distance between the substrate and the heater is arranged to be 35 mm. The deposition substrate is fully heated under the same condition as described above. The temperature distribution of the deposition substrate is changed as shown in FIG. 28. When the temperature is averaged in a diameter direction of the deposition substrate, the temperature at the center of the deposition substrate is 193.2 degree Celsius while the temperature at the position 30 mm apart from the center of the deposition substrate is 191.2 degree Celsius, and a difference between the temperatures is 2.0 degree Celsius.

Figure 29:
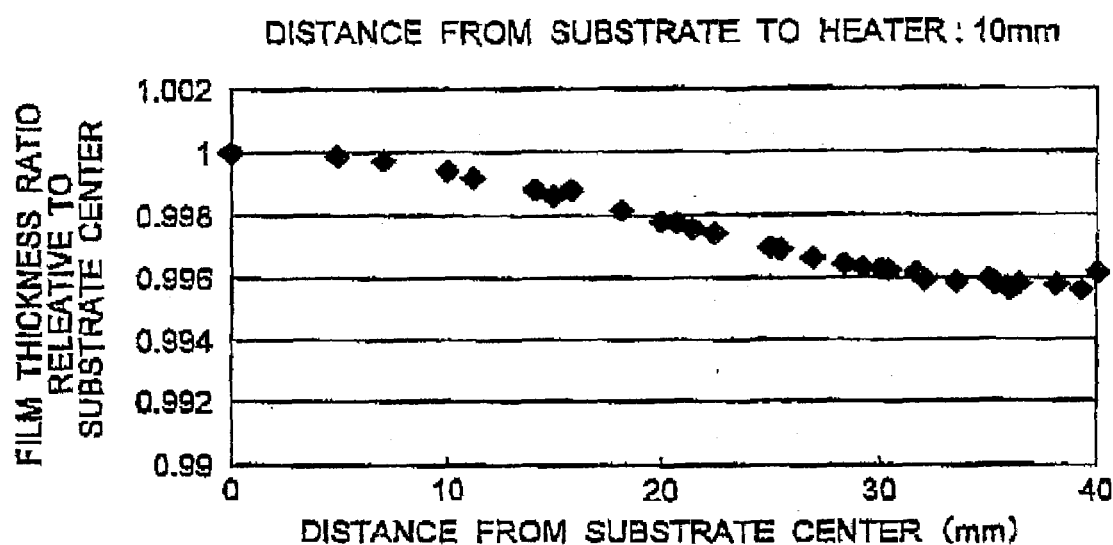
FIG. 29 is a diagram showing a deposition thickness distribution of the deposition substrate in case that the distance between the deposition substrate and the heater is 10 mm.

A distance between the deposition substrate and the plane containing the deposition source is arranged to be 650 mm, and the distance between the rotational axis of the deposition substrate and the deposition source is arranged to be 500 mm, and then a silicon dioxide is deposited with rotating the substrate. When the distance between the deposition substrate and the heater is 10 mm, the thickness distribution represented with the center of the substrate being 1 as a reference is shown in FIG. 29. The film thickness rate at the position 30 mm apart from the center of the deposition substrate becomes 0.9963 with the center of the substrate being 1.

Figure 30:
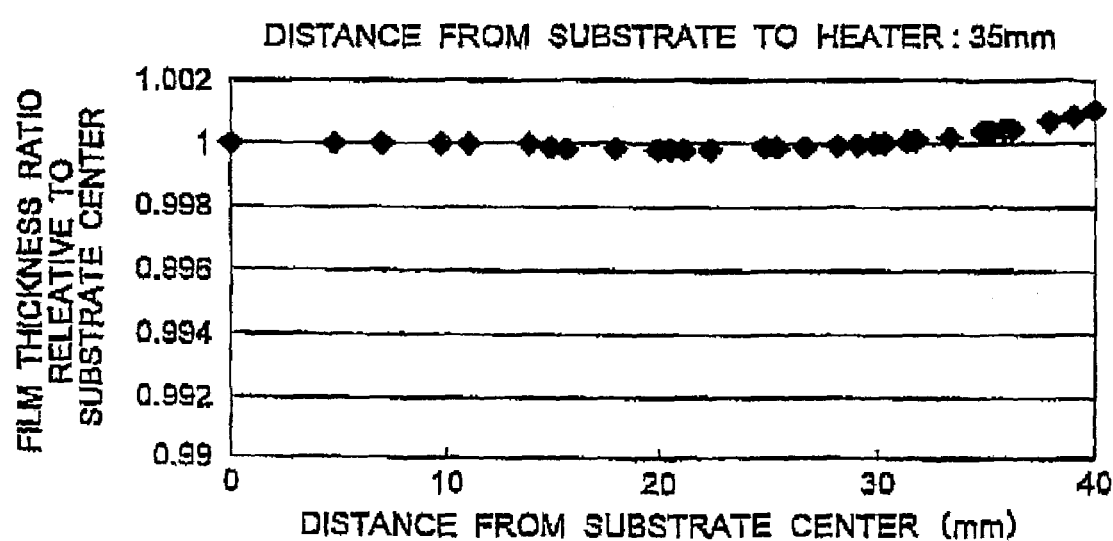
FIG. 30 is a diagram showing a deposition thickness distribution of the deposition substrate in case that the distance between the deposition substrate and the heater is 35 mm.

When the distance between the deposition substrate and the heater is 35 mm, the thickness distribution represented with the center of the substrate being 1 as a reference is shown in FIG. 30. The film thickness ratio at the position 30 mm apart from the center of the deposition substrate becomes 1.0001 with the center of the substrate being 1.

As a result, by means of the temperature control of a temperature difference between the center of the deposition substrate and the position 30 mm apart from the center of the deposition substrate to be set from 6.0 degree Celsius to 2.0 degree Celsius, the deviation of the film thickness ratio at the position 30 mm apart from the center of the deposition substrate can be improved from 0.0037 to 0.0001.

When an inner lateral face of the vacuum chamber located near the deposition substrate is made of a material which is likely to absorb or reflect infrared light, temperature control of the deposition substrate can be performed accurately. Further, when a temperature sensor is provided at the deposition substrate or the substrate holder, temperature control of the deposition substrate in film depositing can be performed more accurately. Furthermore, if the temperature at the periphery of the deposition substrate is desired to be kept lower than the temperature at the center of the deposition substrate, the substrate holder may be made of a material which has excellent heat conductivity. This is because heat on the periphery of the deposition substrate is dissipated via the substrate holder. This technique is effective particularly in manufacturing BPFs with different optical characteristics on a deposition substrate as described later.

As described above, since the re-evaporation of the deposited material is accelerated in the portion in which the temperature of the substrate is higher than that of the other portions, the deposition thickness thereof becomes thinner than the required deposition thickness. Considering the above, the deposition thickness may be made uniform all over the substrate surface by the following manner as that the temperature of the substrate surface is to be made higher at the portion in which a deposition thickness becomes thicker than the required thickness, and the temperature of the substrate surface is to be made lower at the portion in which a deposition thickness becomes thinner than the required thickness.

Figure 36:
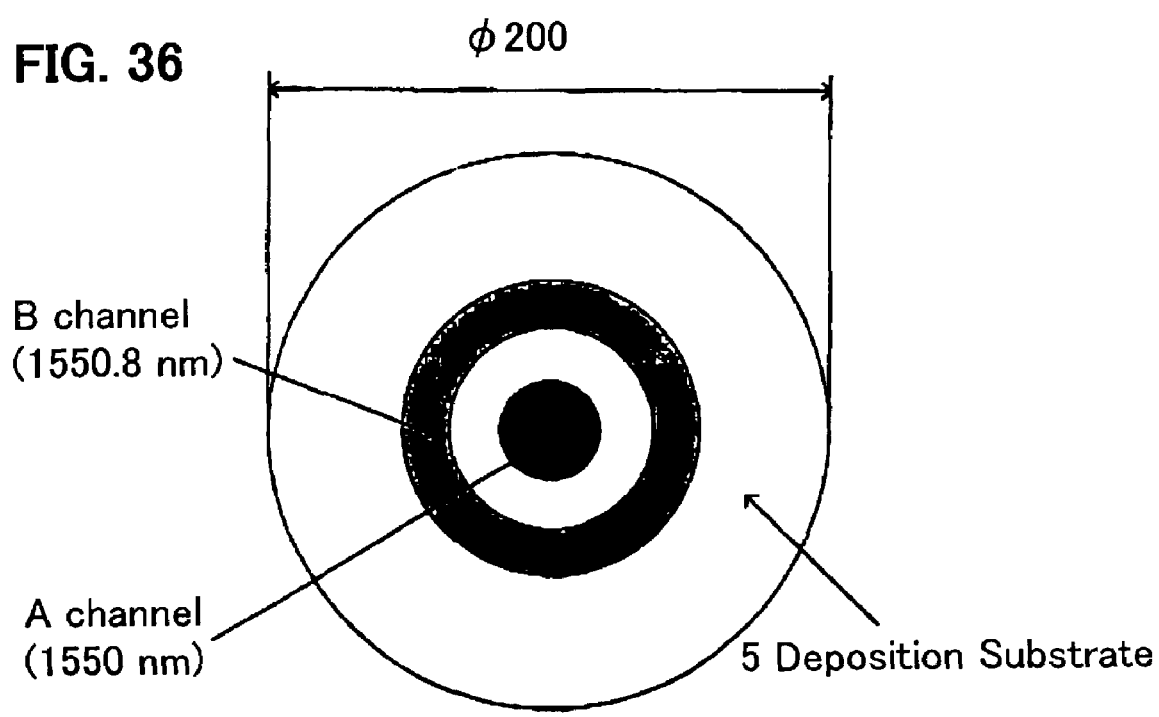
FIG. 36 is a view of BPFs with different optical characteristics produced on one deposition substrate.
Figure 37:
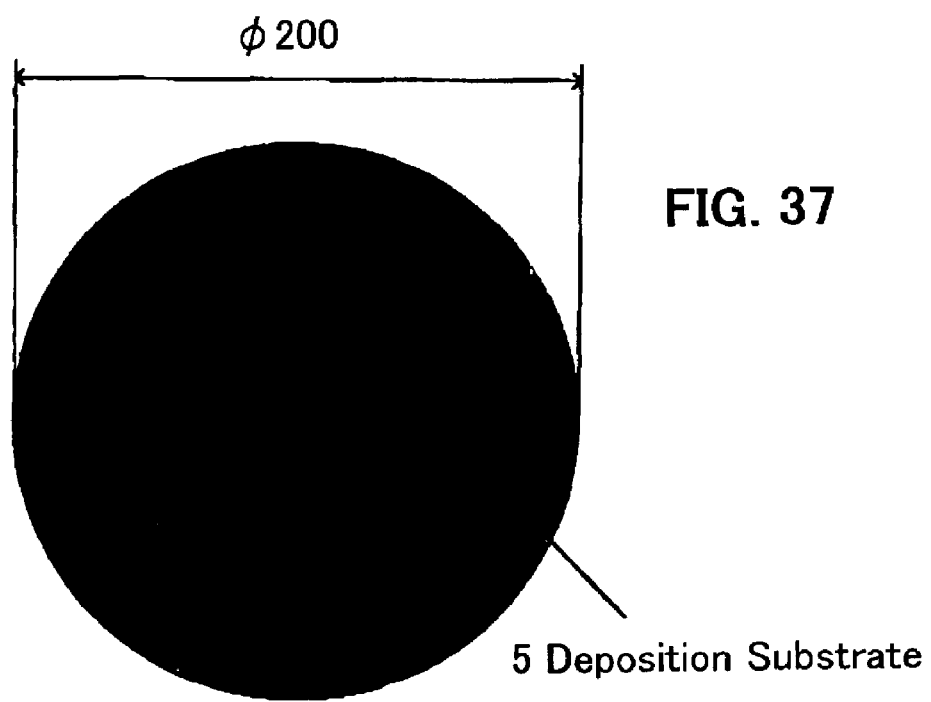
FIG. 37 is a view of a BPF with a single optical characteristic produced on one deposition substrate.

In manufacturing BPFs with different optical characteristics on one deposition substrate, temperature control is performed so as to provide a deposition thickness distribution on the deposition substrate. More specifically, the temperature of the deposition substrate surface is controlled to be lower at a portion in which the deposition thickness is thicker, while the temperature of the deposition substrate surface is controlled to be higher at a portion in which the deposition thickness is thinner. As a result, BPFs having various thicknesses are formed on one deposition substrate, and in other words, the BPFs with different optical characteristics are produced on the same deposition substrate, which is schematically shown in FIG. 36.

Figure 38:
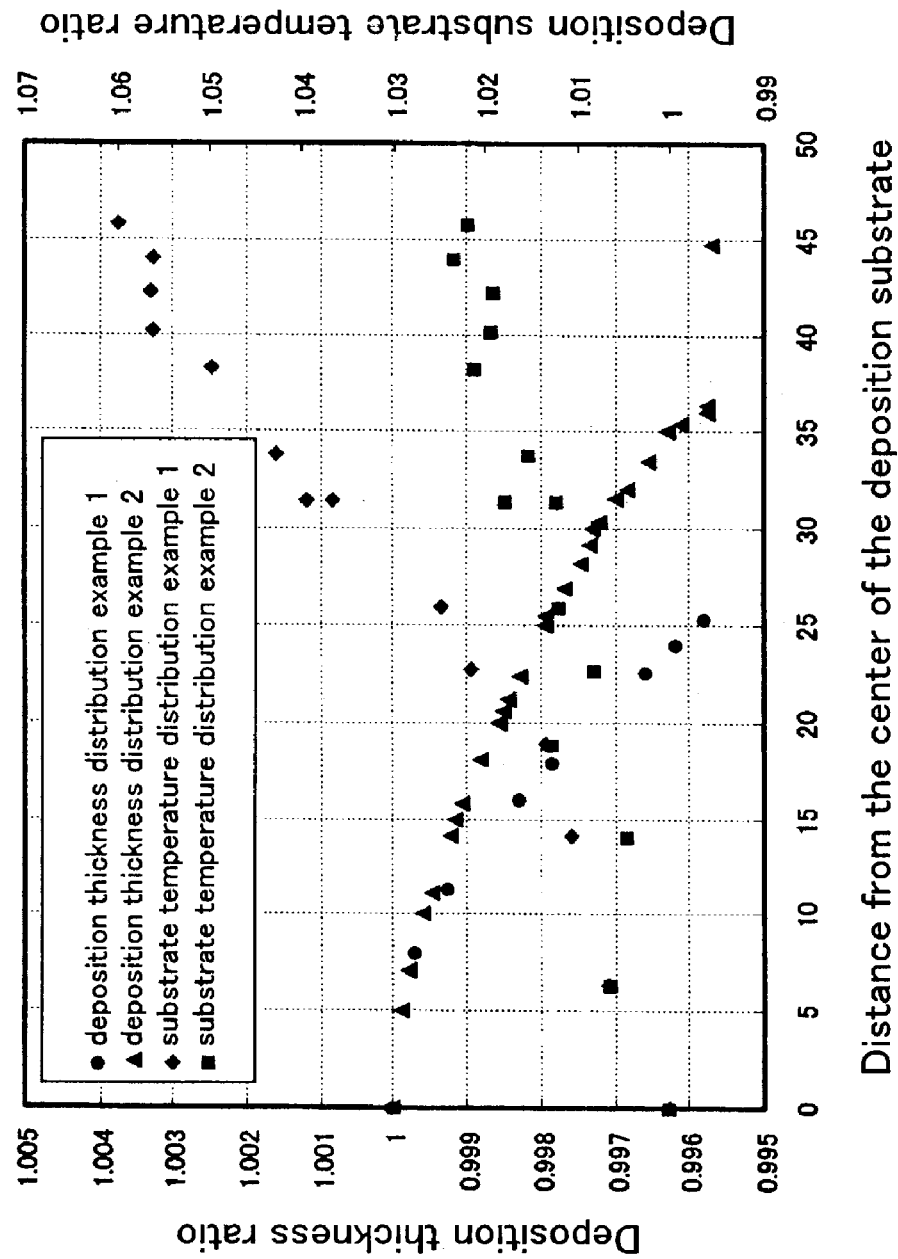
FIG. 38 is a graph of a deposition substrate temperature ratio and a deposition thickness ratio both between the center of the deposition substrate and each distance from the center of the deposition substrate.

In order to investigate the relationship between temperature distribution and optical deposition thickness distribution of the deposition substrate, a temperature of heating sources provided at the periphery of the deposition substrate is adjusted to obtain temperature distribution and optical deposition thickness distribution in the diameter direction of the deposition substrate, of which results are shown in FIG. 38. In this experiment, $SiO_2$ is used as a deposition material, and deposition is performed in such a manner that the center of the deposition substrate is set for 1,550 nm (channel A) as shown in FIG. 36. Then, the substrate temperature ratio and the deposition thickness ratio are measured between the center of the deposition substrate and each distance therefrom on the deposition substrate. From measurement results, it is seen that the deposition thickness tends to become thicker when the temperature of the deposition substrate is low and the deposition thickness tends to become thinner when the temperature of the deposition substrate is high. This shows that temperature of the deposition substrate has a relationship with evaporation of the raw material.

As seen from FIG. 38, deposition distribution on the deposition substrate (optical deposition thickness distribution) can be controlled by adjusting the temperature distribution of the deposition substrate. For example, consider an optical film which is obtained by depositing high refractive index/low refractive index materials layers. Even if the film has a thickness distribution for each refractive index material, the thickness distribution can be made the same for both of the materials by adjusting the temperature distribution of the deposition substrate in depositing of the optical film layers. Also, the optical deposition thickness distribution can be controlled for each portion on the deposition substrate by adjusting the temperature distribution of the deposition substrate in depositing of the optical film layers.

In addition, as described in the Japanese Patent Application No. 2001-401666, the thickness distribution can be made further uniform by doing the layout of a deposition substrate and deposition sources for each deposition material to adjust the thickness distribution before adjusting the temperature distribution of the deposition substrate.

Then a method for controlling the deposition thickness distribution of the substrate is described hereunder which uses the above-mentioned method for arranging a prescribed temperature distribution in the substrate, in corresponding to a different kinds of the features. FIG. 31 is a schematic graph showing a simulation of the conventional optical deposition thickness distribution on the substrate. In general, it shows by a curved-line, however, it is approximated by a straight-line. As is clear from FIG. 31, an optical deposition thickness distribution is different in the radial directions of H layers and L layers.

Here, the deposition film is simulated in relation to the band pass filter (BPF) based on the following film design:

| | |
|---|---|
| Film construction: | Air/L(7-4-7)L(8-4-8)L(8-6-8)L(8-4-8)L(7-4-7)L/ Substrate |
| | (7-4-7) = (HL)$^7$H4LH(LH)$^7$ |
| | (8-4-8) = (HL)$^8$H4LH(LH)$^8$ |
| | (8-6-8) = (HL)$^8$H6LH(LH)$^8$ |
| Designed center wavelength: | 1550.00 nm |

As shown in FIG. 32, when R1 and R2 are sequentially arranged to the outer side in the radial direction from the center point R0 of the deposition substrate, the optical characteristics of the band pass filter are deteriorated as it goes apart from the center of the substrate.

Now, the example of the present invention is described. The optical deposition thickness distribution on the deposition substrate as shown in FIG. 33 can be obtained by arranging a prescribed temperature distribution on the substrate. FIG. 33 also shows a simulation, and in general, it shows by a curved-line, however, it is approximated by a straight-line. In this case, the optical deposition thickness distribution is identical in both radial directions of H layers and L layers because of the appropriate control of the temperature distribution.

The wavelength characteristics of the band pass filter (BPF) having the above-mentioned film construction is simulated. The result thereof is shown in FIG. 34. The band pass filter (BPF) in which the optical characteristics (loss characteristics) are not deteriorated can be obtained in any portion within the deposition substrate, thus improving the yield.

Furthermore, as is clear from FIG. 34, since the center wavelength of the obtained band pass filter (BPF) is different, a band pass filter (BPF) for a plurality of wavelengths can be obtained.

As described above, by means of controlling deposition thickness, the deposition thickness distribution is intentionally made, thus a band pass filter (BPF) for a plurality of grids can be manufactured for one batch of the deposited film little by little at one time.

In addition, by means of adjusting the deposition thickness distribution, a wavelength distribution of the filter and the number of the filters obtained by one batch can be adjusted in corresponding to the cases.

Further, in order to equalize optical deposition thickness distributions in the radial direction of H layers and L layers, there is used a method for adjusting relative positions of each of the deposition sources and the deposition substrate. When $SiO_2$ is deposited as L layers, the relative positions are adjusted to meet Xk/Zk=0.71. On the other hand, when $Ta_2O_5$ is deposited as H layers, the relative positions are adjusted to meet Xk/Zk=0.6. In order to adjust relative positions of the deposition substrate and each of the deposition sources, a position adjusting apparatus has only to be mounted on at least one of the deposition substrate and the deposition sources.

There is also used a method for controlling a deposition amount to the deposition substrate to equalize optical deposition thickness distributions in the radial direction of H layers and L layers. More specifically, a deposition controlling plate is interpositioned between each of the deposition sources and the deposition substrate. Preferably, the deposition controlling plate is arranged directly below the deposition substrate. This deposition controlling plate take the shape of quarter sector and is to prevent deposition of a material onto the deposition substrate. In other words, the deposition substrate is not subject to deposition of a material for a time during one turn of the deposition substrate. The shape of the deposition controlling plate is not limited to quarter sector shape but may be changed in accordance with the controlling amount of deposition.

Next, a deposition method is described for forming optical films having different optical characteristics (channel A and channel B) at a time on the above-described deposition substrate. The following description is made, for example, about deposition of BPFs of which a grid space between channels at 100 GHz is 0.8 nm.

When an observed wavelength of the deposition substrate in a thin film deposition apparatus is 1,550 nm (wavelength observed at the center of the deposition substrate), a thickness error corresponding to the space 0.8 nm is 0.052% relative to the center. In other words, a BPF having an optical characteristic of another channel (channel B) is manufactured at a region of which the thickness error is around 0.052% in the deposition substrate. FIG. 36 schematically shows optical films with different optical characteristics being formed on the same deposition substrate at a time.

As is clear from FIG. 12, when a deposition substrate is arranged at Zk=700 mm, for example, a deposition thickness distribution is uniform all over the substrate. Therefore, it is possible to produce a BPF of one channel over a wide range of the deposition substrate.

On the other hand, when a deposition source is arranged at Zk=750 mm, this thickness ratio corresponds to a region about 50 mm away from the center of the deposition substrate. Therefore, as shown in FIG. 36, it is possible to produce a BPF of channel B in the region about 50 mm away from the center of the deposition substrate.

Accordingly, by controlling a thickness distribution with the use of means for arranging deposition sources at appropriate positions or the like, not only is a BPF of a single channel (channel A) produced in large quantity, but the BPF is produced with another channel (channel B) in addition to the channel A. Although BPFs are adopted in the above description, the above-described deposition method may be applicable to any other filters.

As described above, by means of arranging the temperature distribution on the substrate, using one or more than two heating sources or cooling sources arranged in the near portion of the substrate, the deposition thickness distribution can be positively adjusted within the substrate, thus filters having various kinds of wavelength distribution can be manufactured with higher yield by one batch.

What is claimed is:

1. A thin film deposition method for producing an optical film with an optical characteristic on a deposition substrate in a vacuum chamber, comprising:

(a) preparing in the vacuum chamber a deposition source which is a source of a film producing material;
(b) holding the deposition substrate by means of a substrate holding member;
(c) arranging the deposition substrate and the deposition source in such a manner that, given that a point of intersection of a horizontal plane containing said deposition source and a reference line which passes through a center of the deposition substrate and is orthogonal to the horizontal plane is defined as a first point of intersection, and a distance front the first point of intersection to the center of the deposition substrate is defined as Zk and a distance from the first point of intersection to the deposition source is defined as Xk, Xk/Zk is set to satisfy a following equation:

$$0.48 \leq Xk/Zk \leq 0.78; \text{ and}$$

(d) evaporating the film producing material of said deposition source to perform deposition on the deposition substrate.

2. A thin film deposition method for producing an optical film with an optical characteristic on a deposition substrate in a vacuum chamber as claimed in claim 1, comprising further:
(a) holding the deposition substrate by means of a substrate holding member in such a manner that the deposition substrate is declined at a predetermined inclination angle relative to the horizontal plane;
(b) evaporating the film producing material of said deposition source in the vacuum chamber to perform deposition on the deposition substrate while the deposition substrate is rotated on a rotational axis which is orthogonal to the deposition substrate.

3. A thin film deposition method for producing an optical film with an optical characteristic on a deposition substrate in a vacuum chamber, as claimed in claim 1, further comprising:
(a) arranging at least two deposition sources at predetermined positions;
(b) rotating the deposition substrate on a center axis of the deposition substrate, said deposition substrate being inclined at a predetermined angle relative to a horizontal plane containing one of said deposition sources, and depositing an evaporated material of said deposition source on the deposition substrate to produce a film; and
(c) controlling a deposition operation of each of said at least two deposition sources by an amount of light which is allowed to pass through the film deposited on the deposition substrate so as to leave the film with a predetermined thickness.

4. The thin film deposition method as claimed in claim 3, wherein said deposition sources include film producing materials of different reflective indices, and are individually opened/shut-off of a cover over the deposition sources so as to control the deposition operation.

5. A thin film deposition method for producing an optical film with an optical characteristic on a deposition substrate in the vacuum chamber, as claimed in claim 1, further comprising:
(a) providing the deposition substrate with a prescribed temperature distribution; and
(b) evaporating the film producing material of said deposition source in the vacuum chamber to perform deposition on the deposition substrate while the deposition substrate is rotated on a rotational axis which is orthogonal to the deposition substrate.

6. The thin film deposition method as claimed in claim 5, wherein said providing of the deposition substrate with the prescribed temperature distribution is performed by using a heating source and/or a cooling source which is provided for the deposition substrate to deposit the film producing material on the deposition substrate.

7. The thin film deposition method as claimed in claim 5, wherein the temperature distribution of the deposition substrate is adjusted for each evaporation material from said deposition source.

8. A thin film deposition method for producing an optical film with an optical characteristic on a deposition substrate in a vacuum chamber, comprising:
(a) preparing in the vacuum chamber a deposition source which is a source of the film producing material;
(b) holding the deposition substrate by means of a substrate holding member in such a manner that the deposition substrate is declined at a predetermined inclination angle relative to the horizontal plane;
(c) arranging the deposition substrate and the deposition source in such a manner that, given that a point of intersection of a horizontal plane containing said deposition source and a reference line which passes through a center of the deposition substrate and is orthogonal to the horizontal plane is defined as a first point of intersection, and a distance from the first point of intersection to the center of the deposition substrate is defined as Zk and a distance from the first point of intersection to the deposition source is defined as Xk, Xk/Zk is set to satisfy a following equation, $$0.2 \leq Xk/Zk < 0.48;$$

(d) rotating the deposition substrate on a rotational axis which is orthogonal to the deposition substrate; and
(e) evaporating the film producing material of said deposition source to perform deposition on the deposition substrate.

9. The thin film deposition method as claimed in claim 8, wherein the temperature distribution of the deposition substrate is adjusted in each film producing material evaporation from said deposition source.

* * * * *